United States Patent
Park et al.

(10) Patent No.: US 9,184,400 B2
(45) Date of Patent: Nov. 10, 2015

(54) METHODS OF MAKING ORGANIC PHOTOVOLTAIC CELLS HAVING IMPROVED HETEROJUNCTION MORPHOLOGY

(75) Inventors: Hui Joon Park, Beaverton, OR (US); Lingjie Jay Guo, Ann Arbor, MI (US)

(73) Assignee: The Regents Of The University Of Michigan, Ann Arbor, MI (US)

( * ) Notice: Subject to any disclaimer, the term of this patent is extended or adjusted under 35 U.S.C. 154(b) by 27 days.

(21) Appl. No.: 13/583,554

(22) PCT Filed: Mar. 9, 2011

(86) PCT No.: PCT/US2011/027748
§ 371 (c)(1),
(2), (4) Date: Sep. 7, 2012

(87) PCT Pub. No.: WO2011/112714
PCT Pub. Date: Sep. 15, 2011

(65) Prior Publication Data
US 2013/0037109 A1  Feb. 14, 2013

Related U.S. Application Data

(60) Provisional application No. 61/311,919, filed on Mar. 9, 2010.

(51) Int. Cl.
*H01L 51/48* (2006.01)
*H01L 51/42* (2006.01)
(Continued)

(52) U.S. Cl.
CPC ........ *H01L 51/4253* (2013.01); *H01L 51/0012* (2013.01); *H01L 51/448* (2013.01);
(Continued)

(58) Field of Classification Search
CPC ........ H01L 51/0002–51/0007; H01L 51/0012; H01L 51/4253; H01L 51/448; H01L 51/0036; H01L 51/0037; H01L 2251/308
USPC .......................... 136/263; 427/74; 438/82, 99
See application file for complete search history.

(56) References Cited

U.S. PATENT DOCUMENTS

2005/0176182 A1*  8/2005  Me et al. .................... 438/149
2009/0046362 A1   2/2009  Guo et al.
(Continued)

FOREIGN PATENT DOCUMENTS

KR   10-2009-0131461 A    12/2009

OTHER PUBLICATIONS

Kang et al, Organic Solar Cells Using Nanoimprinted Transparent Metal Electrodes, 2008, Advanced Materials, vol. 20, pp. 4408-4413.*

(Continued)

*Primary Examiner* — Jonathan Johnson
*Assistant Examiner* — Bethany L Martin
(74) *Attorney, Agent, or Firm* — Harness, Dickey & Pierce, PLC

(57) ABSTRACT

Methods of making a photovoltaic device with an organic liquid precursor having electron donor, electron acceptor, and liquid carrier are provided. The liquid precursor is applied to an electrode. A gas permeable layer/stamp contacts and applies pressure to the organic liquid precursor removing liquid carrier to form a solid active material with uniform interpenetrating network domains of electron donor/acceptor materials. A two-step process is also contemplated. A liquid precursor with either electron donor or acceptor is applied to an electrode, contacted under pressure with a first stamp having a nanoscale pattern, thus forming a solid with a patterned surface. Then, a second liquid precursor with the other of the electron donor or acceptor is applied to the patterned surface, contacted with a second stamp under pressure to form the active material. A transparent conducting electrode with material nanograting can be formed. The methods also include continuous processing, like roll-to-roll manufacturing.

31 Claims, 23 Drawing Sheets

Figure 6:
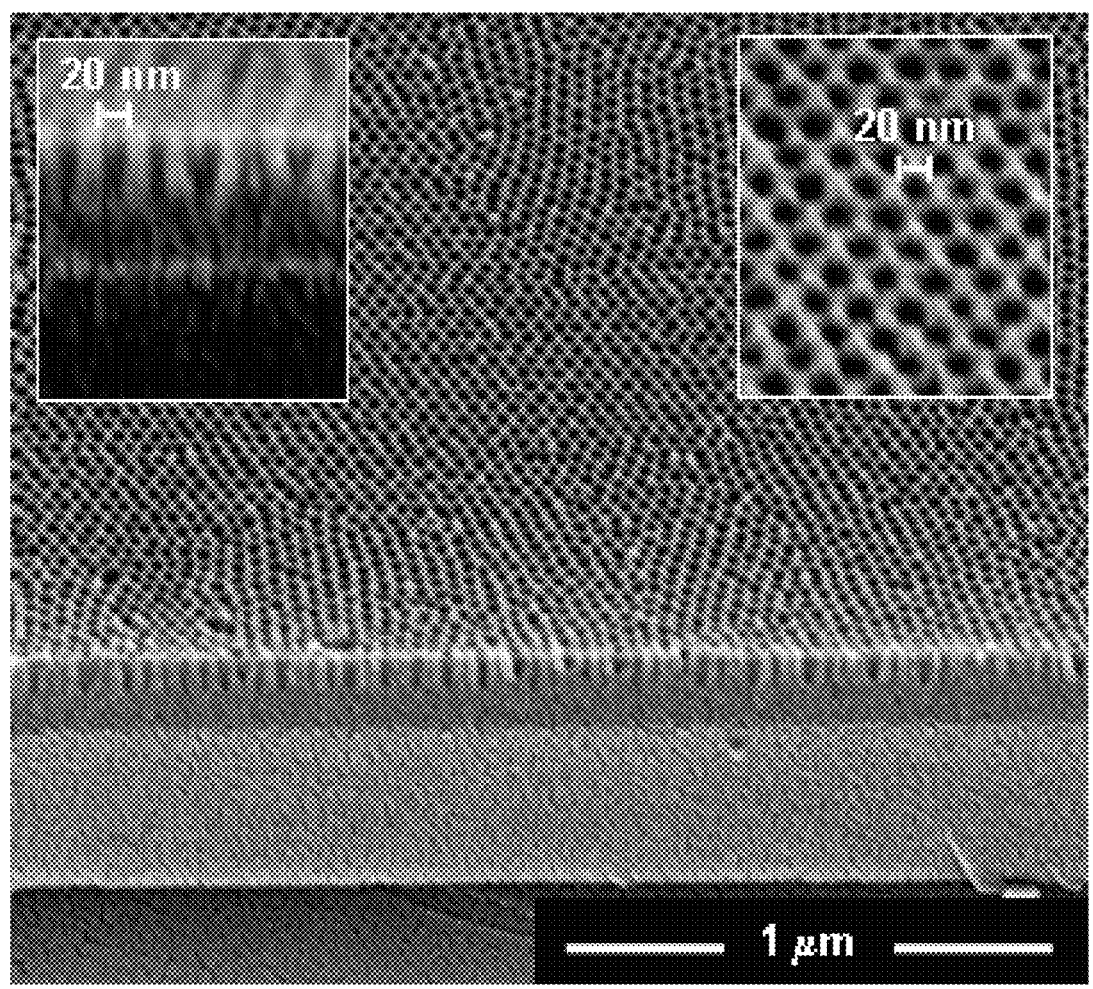

(51) Int. Cl.
  *H01L 51/00* (2006.01)
  *H01L 51/44* (2006.01)
  *H01L 31/18* (2006.01)

(52) U.S. Cl.
  CPC ......... *H01L51/0036* (2013.01); *H01L 51/0037* (2013.01); *H01L 2251/308* (2013.01); *Y02E 10/52* (2013.01); *Y02E 10/549* (2013.01)

(56) References Cited

U.S. PATENT DOCUMENTS

2009/0266418 A1    10/2009  Hu et al.
2009/0293946 A1    12/2009  Lin et al.
2009/0295041 A1*   12/2009  Petrucci-Samija et al. ... 264/494
2009/0314350 A1*   12/2009  Jung et al. ..................... 136/263

OTHER PUBLICATIONS

Lee et al, Structural Complexities in the Active Layers of Organic Electronics, Jan. 2010, Annual Review of Chemical and Biomolecular Engineering, vol. 1 pp. 59-78.*
Li et al, Investigation of annealing effects and film thickness dependence of polymer solar cells based on poly (3-hexylthiophene), 2005, Journal of Applied Physics, vol. 98, pp. 043704-1 to 043704-5.*
Hoppe et al, Morphology of polymer-fullerene bulk heterojunction solar cells, 2005, Journal of Materials Chemistry, vol. 16, pp. 45-61.*
Toepke et al, PDMS absorption of small moledules and consequences in microfluidic applications, 2006, Lab Chip, 1484-1486.*
Merriam-Webster, Definition of "flat".*
Kang, Myung-Gyu et al., "Organic Solar Cells Using Nanoimprinted Transparent Metal Electrodes," Advanced Materials, vol. 20, pp. 4408-4413 (2008) (published online Sep. 5, 2008).
Kang, Myung-Gyu et al., "Nanoimprinted Semitransparent Metal Electrodes and Their Application in Organic Light-Emitting Diodes," Advanced Materials, vol. 19, pp. 1391-1396 (2007) (published online Apr. 25, 2007).
Ahn, Se Hyun et al., "High-Speed Roll-to-Roll Nanoimprint Lithography on Flexible Plastic Substrates," Advanced Materials, vol. 20, pp. 2044-2049 (2008) (published online Apr. 24, 2008).
Ahn, Se Hyun et al., "Large-Area Roll-to-Roll and Roll-to-Plate Nanoimprint Lithography: A Step toward High-Throughput Application of Continuous Nanoimprinting," ACS Nano, vol. 3, No. 8, pp. 2304-2310 (2009) (published online Jul. 2, 2009).
International Search Report and Written Opinion of the International Searching Authority issued on Dec. 21, 2011 in parent application PCT International Application No. PCT/US/2011/027748 (published as WO 2011/112714).
Kang, Myung-Gyu, et al., "Toward Low-Cost, High-Efficiency, and Scalable Organic Solar Cells with Transparent Metal Electrode and Improved Domain Morphology," IEEE Journal of Selected Topics in Quantum Electronics, vol. 16, No. 6, pp. 1807-1820 (Nov.-Dec. 2010) (published online Apr. 29, 2010).
Kim, Myung-Su, et al., "Flexible conjugated polymer photovoltaic cells with controlled heterojunctions fabricated using nanoimprint lithography," Applied Physics Letters, vol. 90, pp. 123113-1 to 123113-3 (2007) (published online Mar. 22, 2007).
Park, Hui Joon, et al., "A Facile Route to Polymer Solar Cells with Optimum Morphology Readily Applicable to a Roll-to-Roll Process without Sacrificing High Device Performance," Advanced Materials, vol. 22, pp. E247-E253 (2010) (published online Apr. 26, 2010).
Park, Hui Joon, et al., "Advanced Heterojunction Structure of Polymer Photovoltaic Cell Generating High Photocurrent with Internal Quantum Efficiency Approaching 100%," Advanced Energy Materials, vol. 3, No. 9, pp. 1135-1142 (Sep. 2013) (published online May 23, 2013).
Park, Hui Joon, et al., "Chapter 6: Processing Technologies of Semiconducting Polymer Composite Thin Films for Photovoltaic Cell Applications," Semiconducting Polymer Composites: Principles, Morphologies, Properties and Applications (ed. Xiaoniu Yang), 1st ed., pp. 171-190 (2012).
International Preliminary Report on Patentability issued on Sep. 11, 2012 in PCT International Application No. PCT/US/2011/027748 (Pub. No. WO 2011/112714).

* cited by examiner

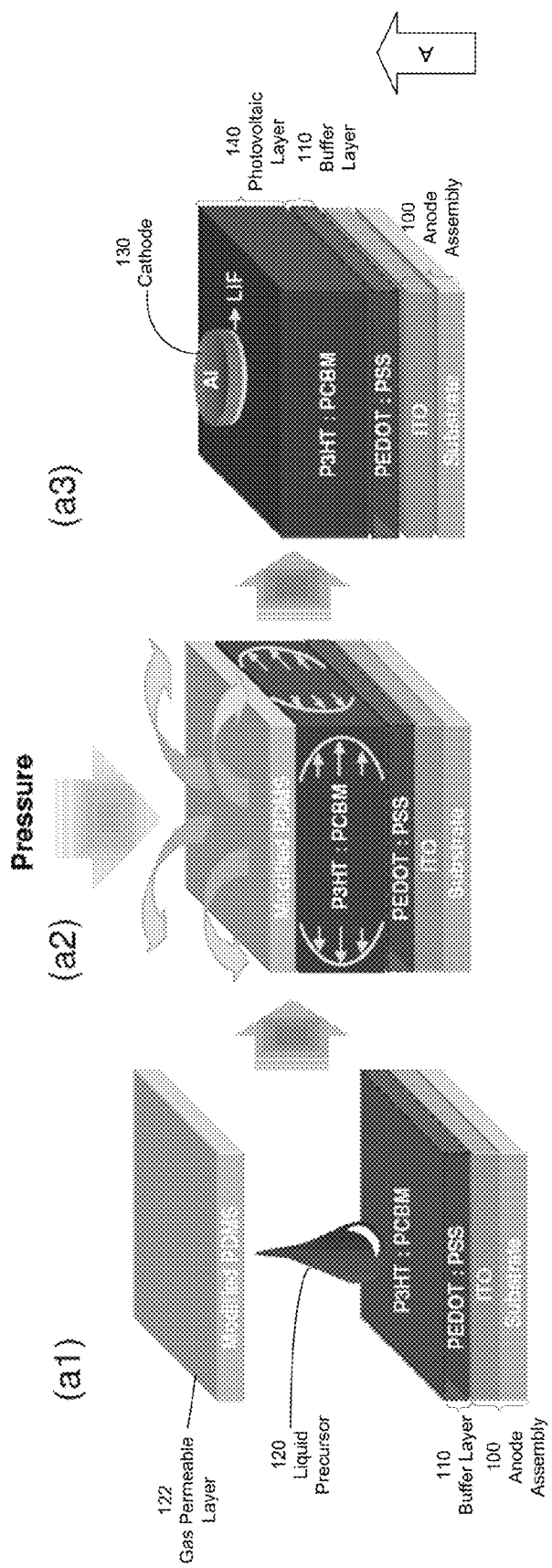
FIGURES 1(a1)-(a3)

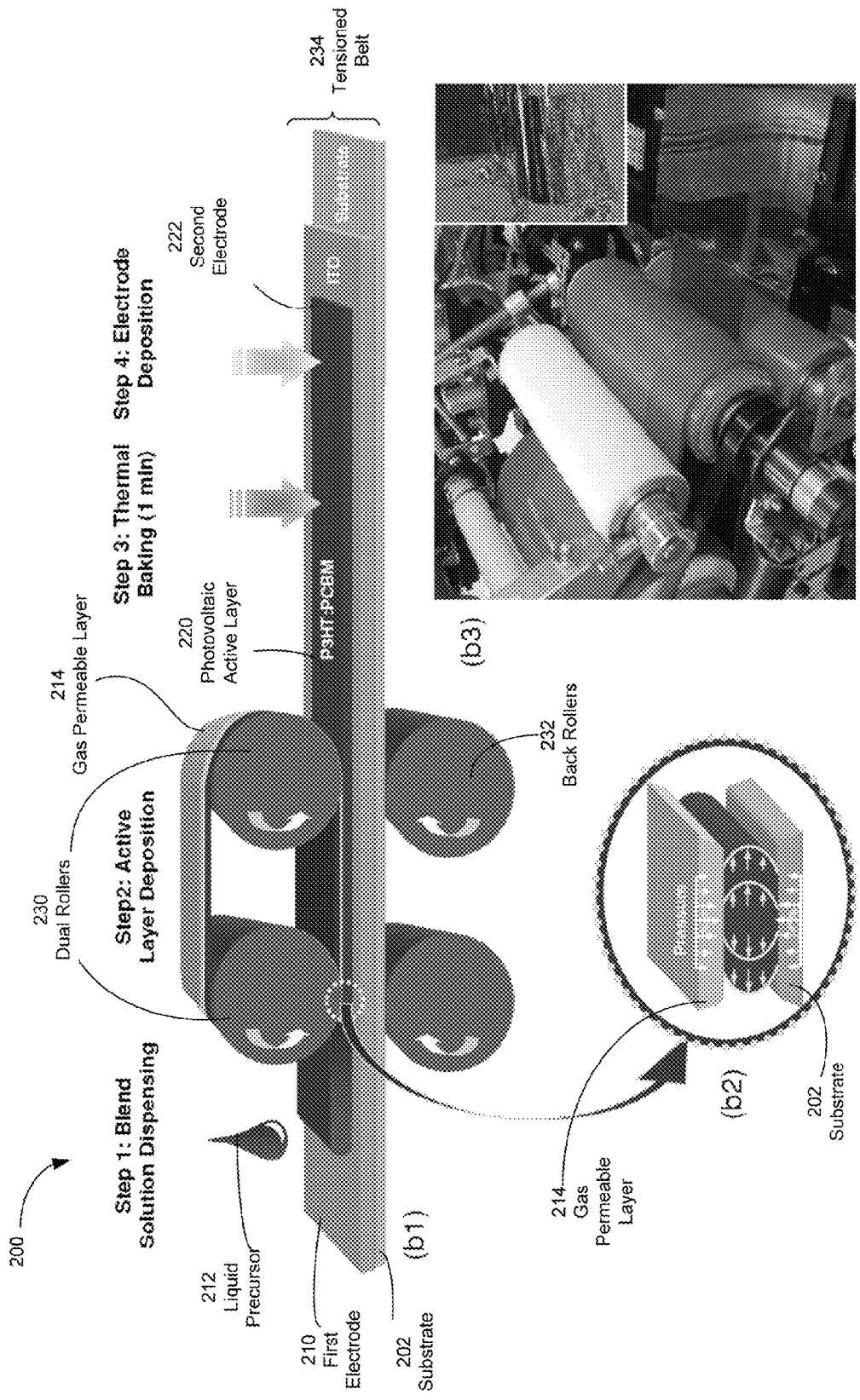
FIGURES 1(b1)-(b3)

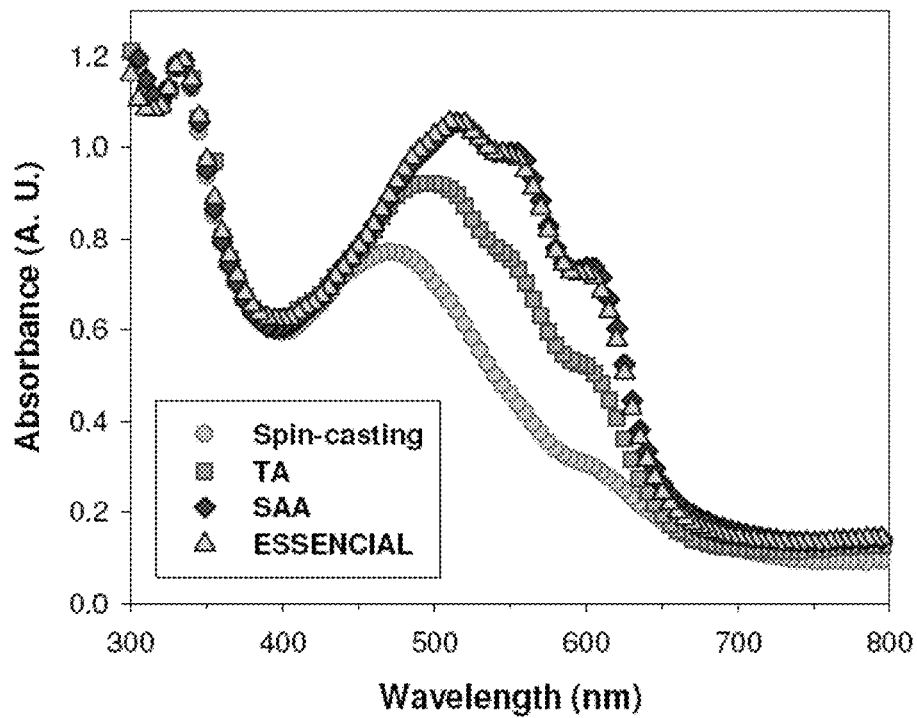
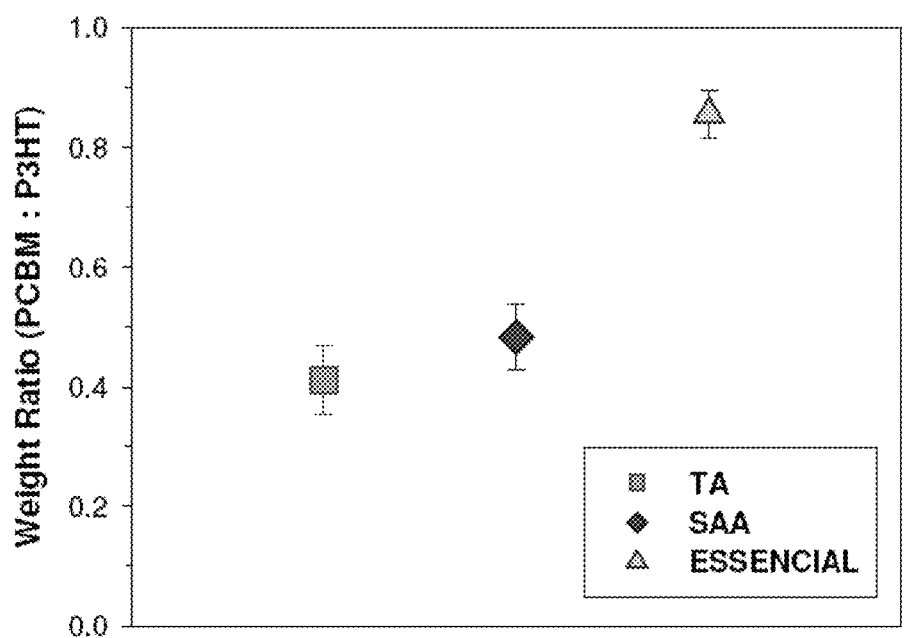
FIGURES 2(a)-(b)

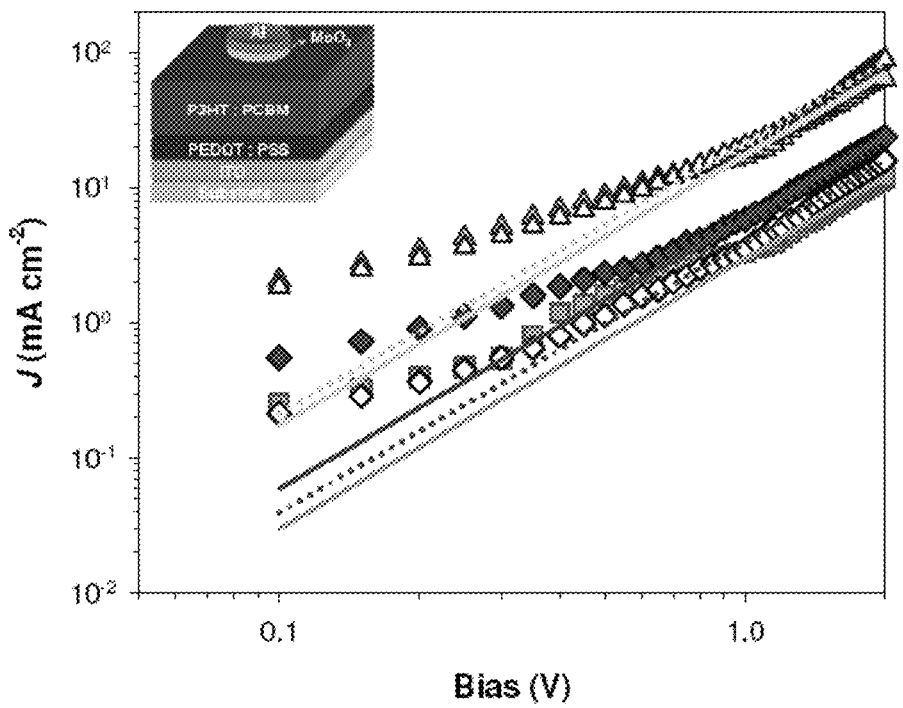
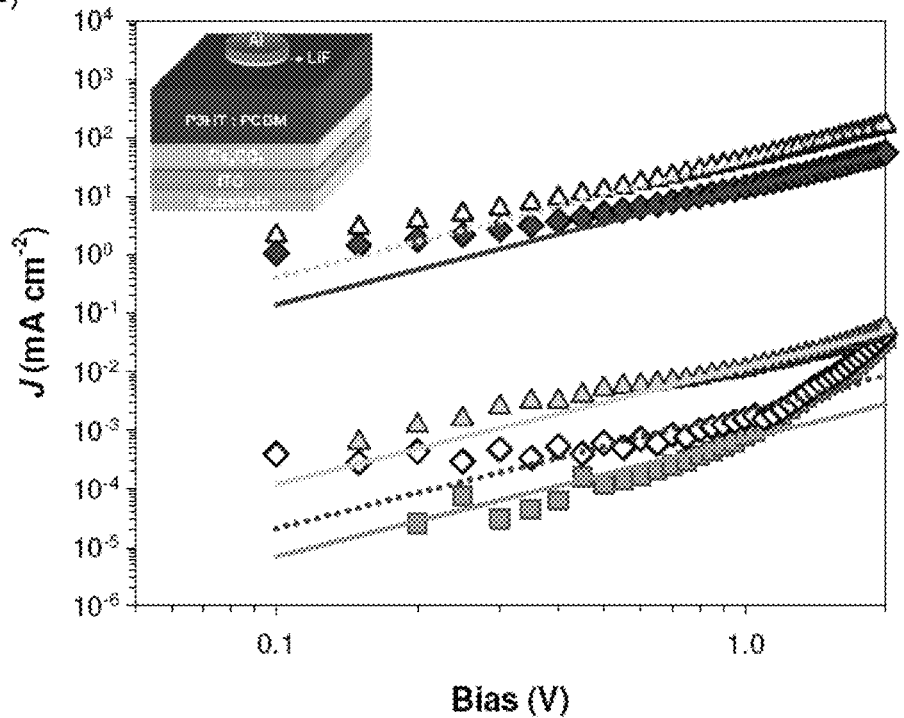
FIGURES 2(c1)-(c2)

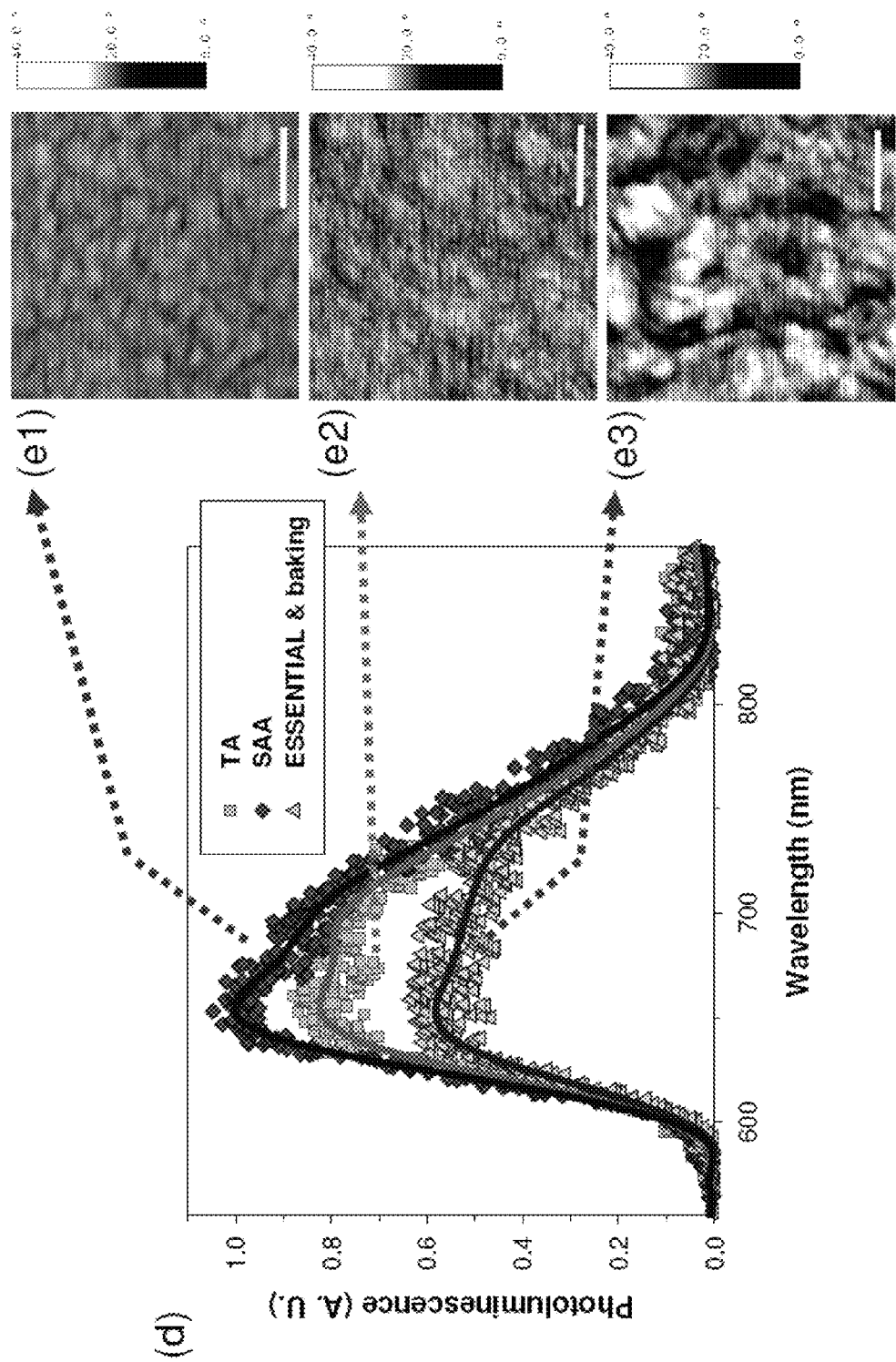
FIGURES 2(d)-(e3)

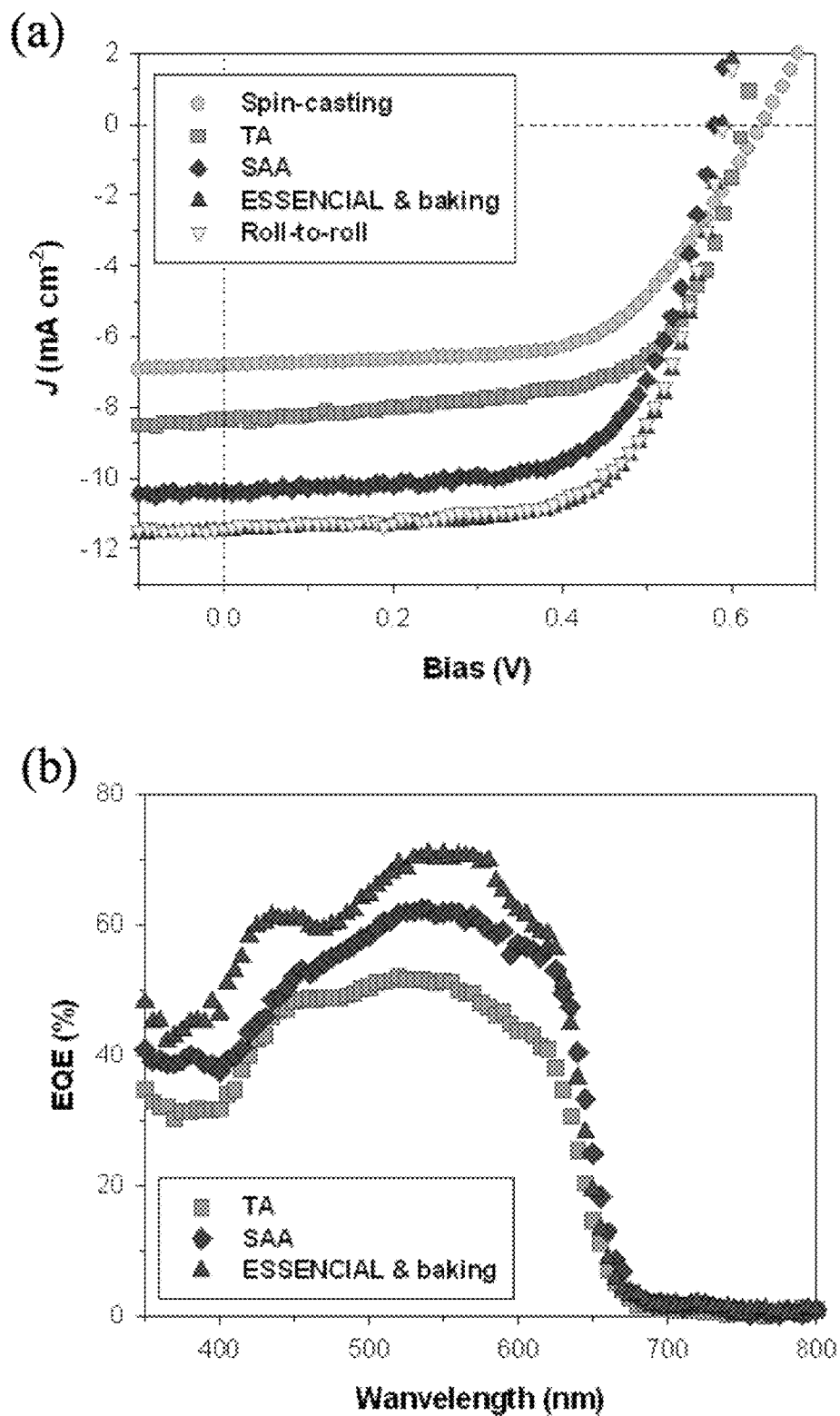
FIGURES 3(a)-(b)

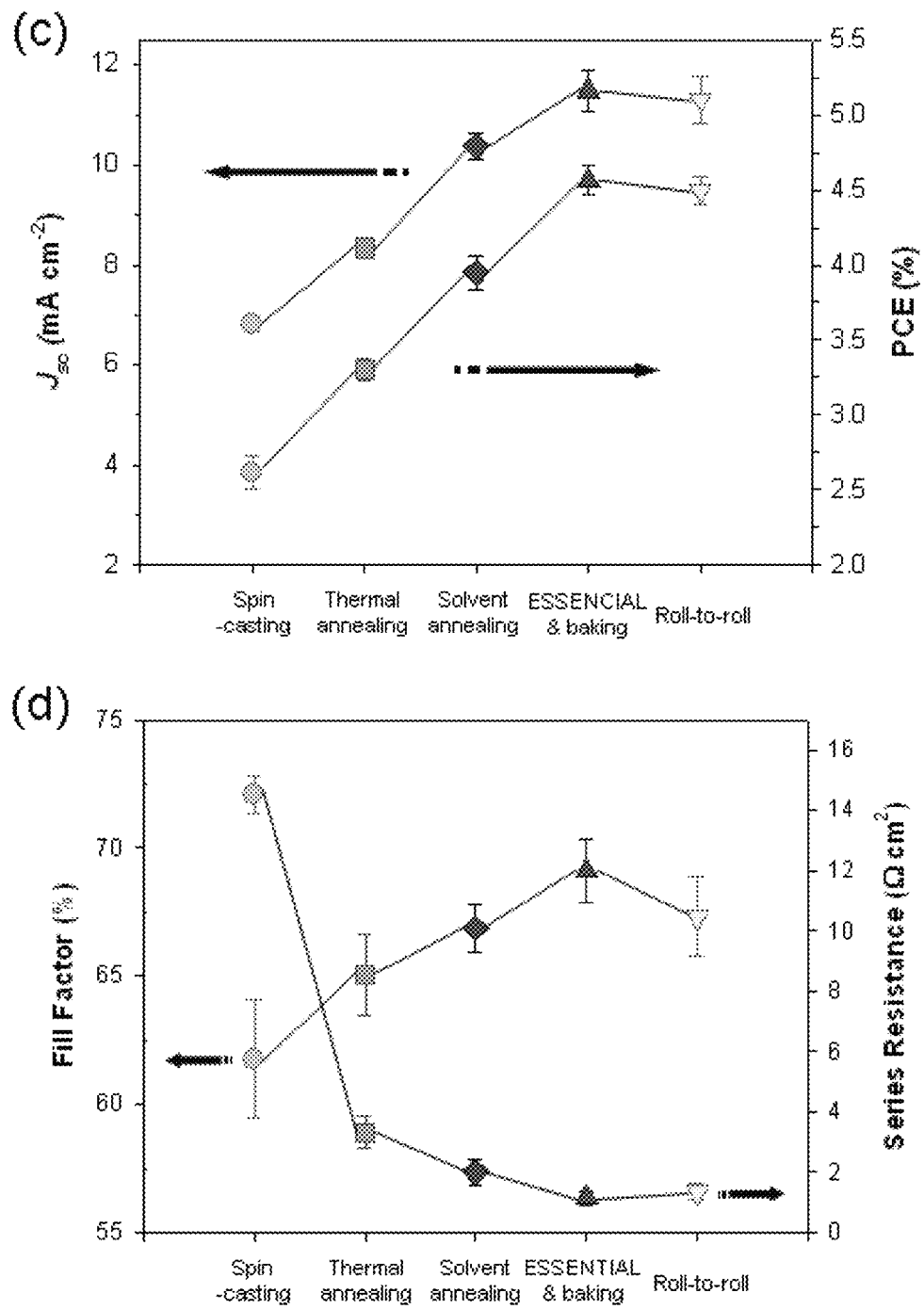
FIGURES 3(c)-(d)

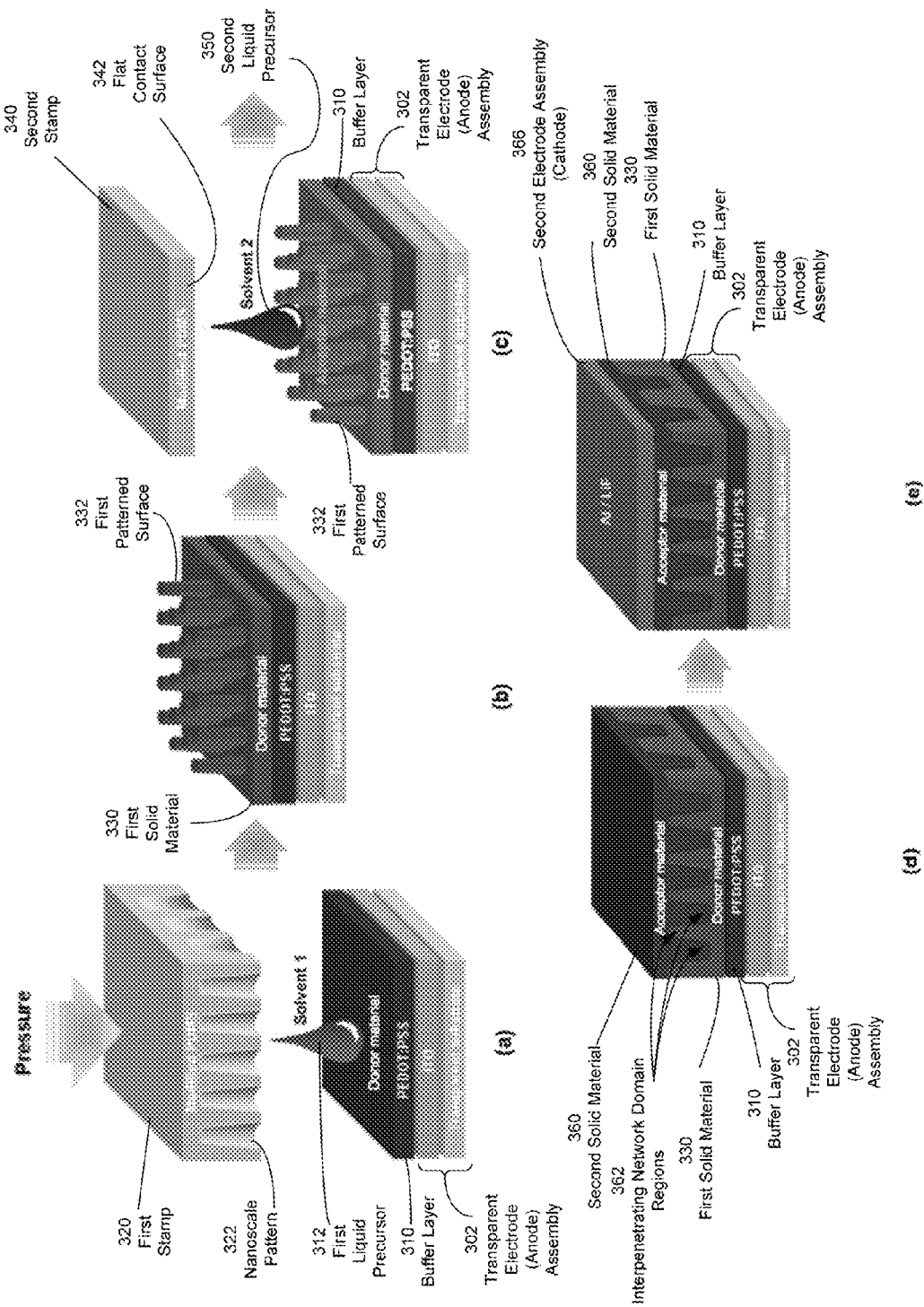
FIGURES 4(a)-(e)

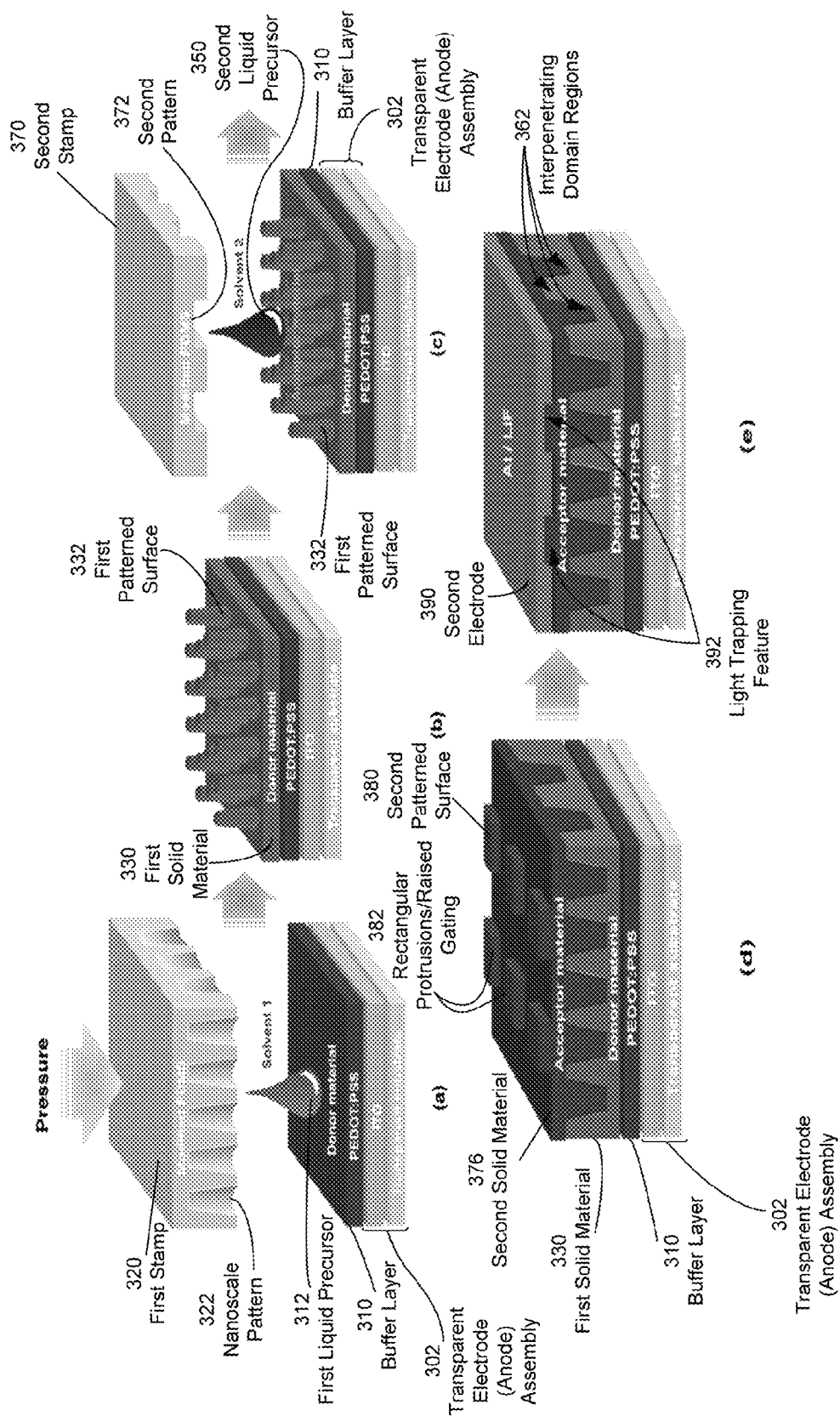
FIGURES 5(a)-(e)

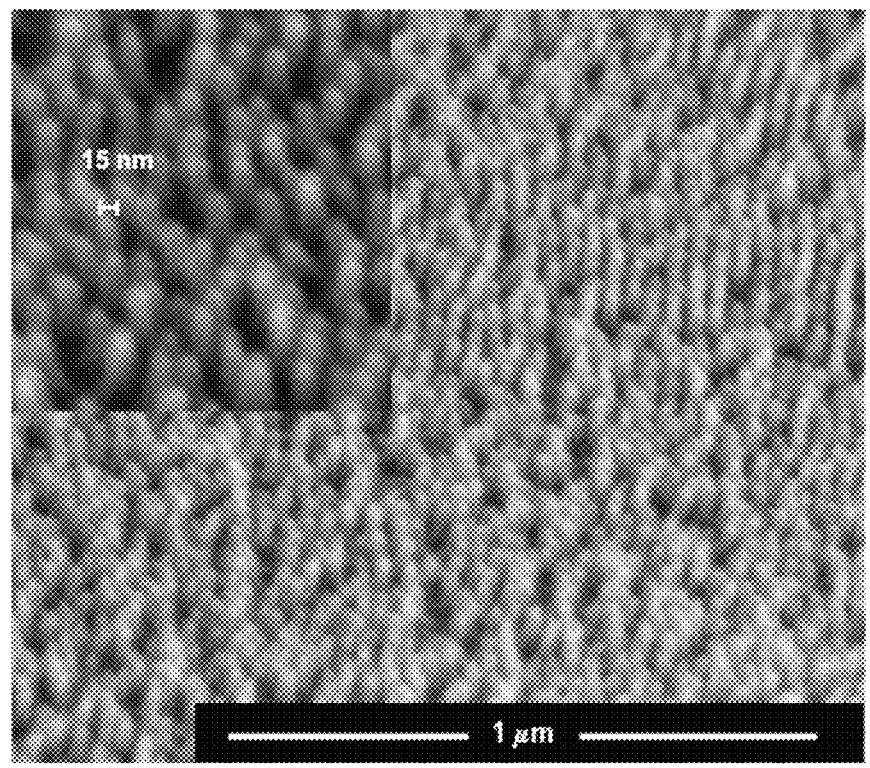
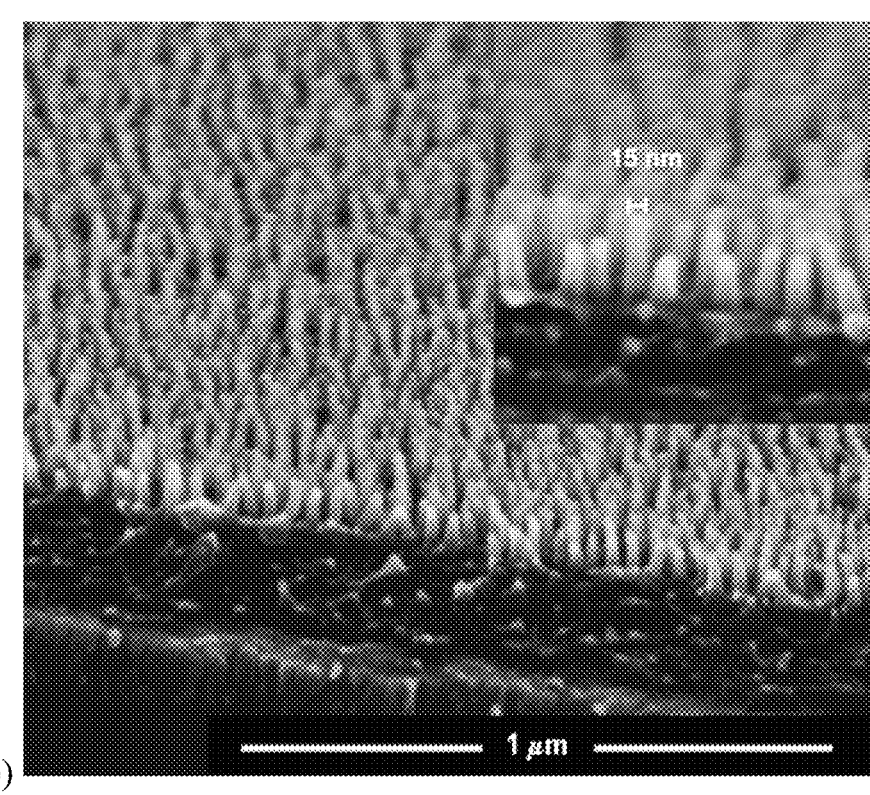
FIGURES 7(a)-(b)

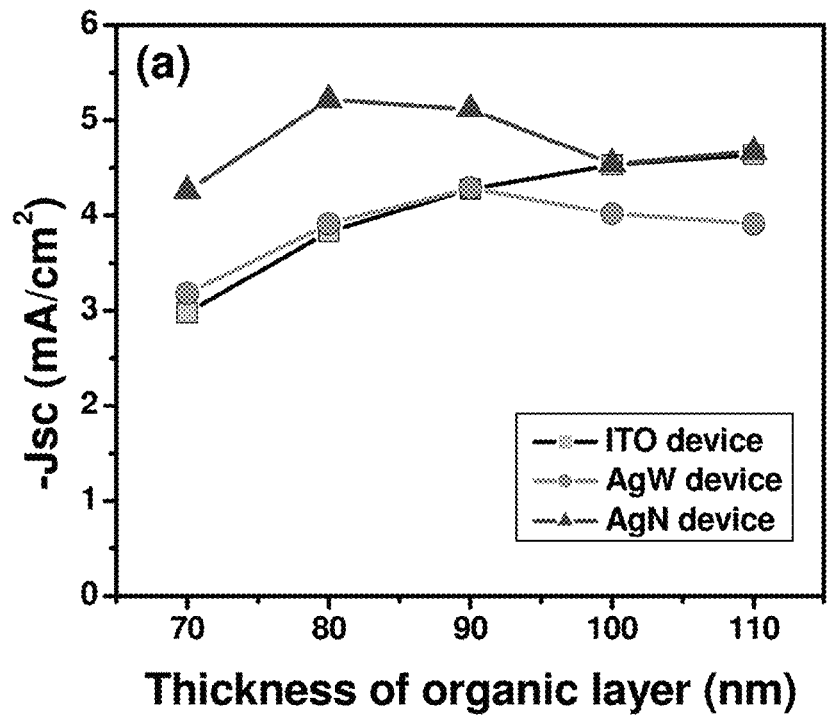
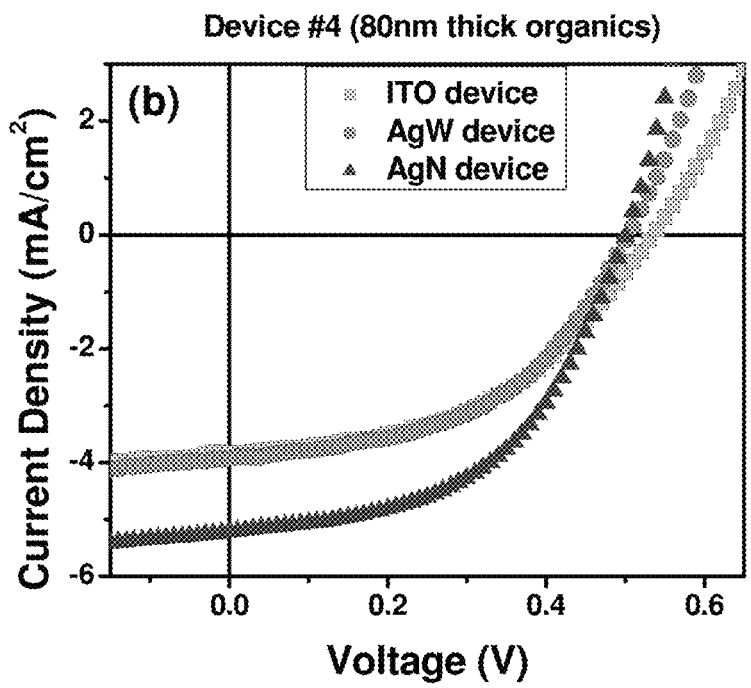
FIGURES 16(a)-(b)

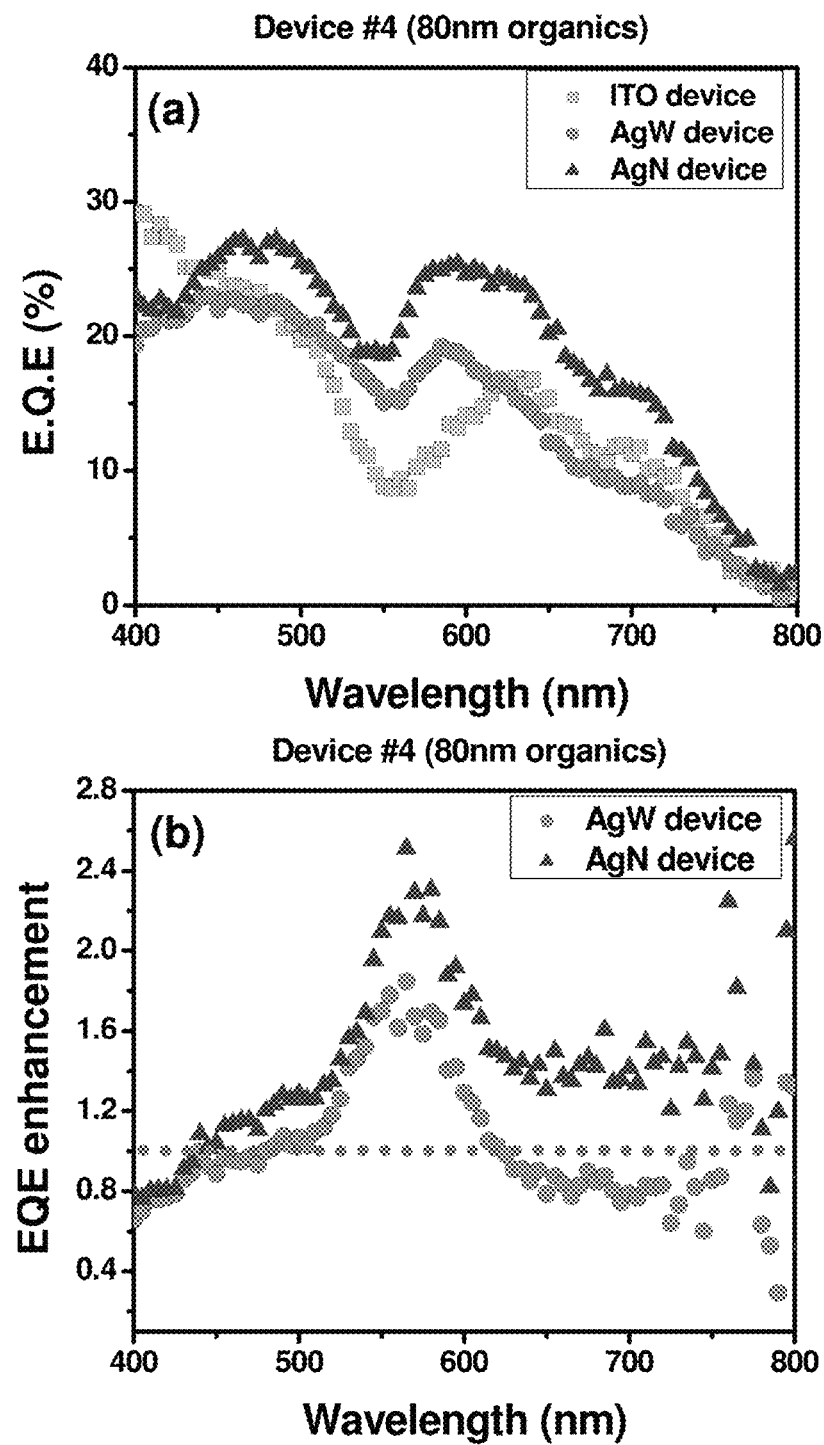
FIGURES 18(a)-(b)

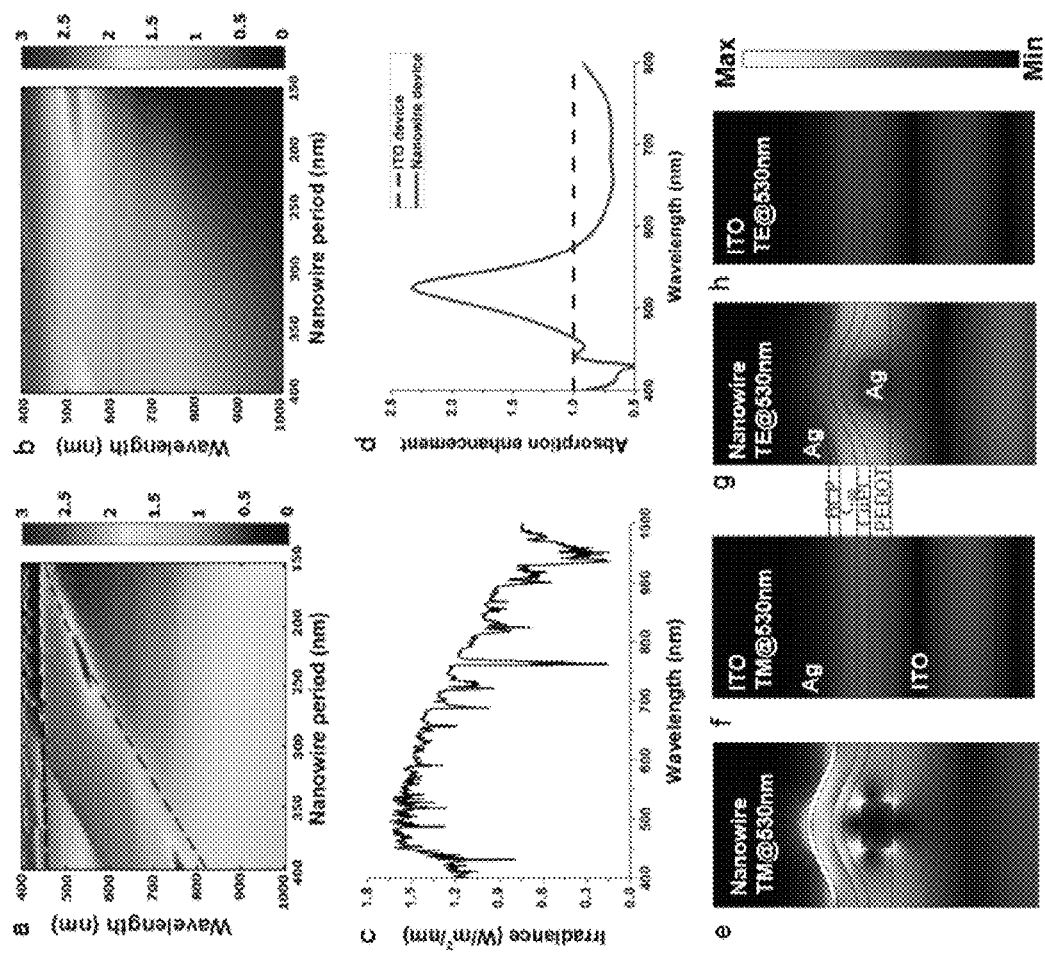
FIGURES 19(a)-(h)

METHODS OF MAKING ORGANIC PHOTOVOLTAIC CELLS HAVING IMPROVED HETEROJUNCTION MORPHOLOGY

CROSS-REFERENCE TO RELATED APPLICATIONS

This application is a National Stage of International Application No. PCT/US11/22748, filed on Mar. 9, 2011, which claims the benefit of U.S. Provisional Application No. 61/311,919, filed on Mar. 9, 2010. The entire disclosures of each of the above applications are incorporated herein by reference.

GOVERNMENT RIGHTS

This invention was made with U.S. government support under EECS0836584 awarded by the National Science Foundation and 70NANB8H8134 awarded by the National Institute of Standards and Technology. The U.S. government has certain rights in the invention.

FIELD

The present technology provides methods of making organic photovoltaic solar cells, for example, by a roll-to-roll process to improve donor-acceptor heterojunction morphology and power conversion efficiency.

INTRODUCTION

This section provides background information related to the present disclosure which is not necessarily prior art.

Cost effective and highly efficient renewable energy is becoming ever more important due to rising energy prices and the serious issue of global warming from burning fossil fuels. Solar energy is a non-exhaustible and green energy. Photovoltaic cells, such as solar cells, are being developed as a promising solution to the energy crisis and environmental pollution. For example, organic solar cells (OSCs) offer an alternative to inorganic solar cells due to their low cost, easy fabrication, and compatibility with flexible substrates over a large area. While the power conversion efficiency (PCE) of OSCs has steadily increased, further enhancement of the PCE, together with low-cost fabrication techniques, are still required for practical applications.

A basic OSC structure includes a number of organic semiconductor layers sandwiched between two electrodes. Most of the organic devices fabricated today use a thick, conductive metal layer as the rear electrode and a transparent conductive electrode (TCE) as the front electrode, which receives light. The TCE is an important component in any photosensitive optoelectronic devices such as organic light emitting diodes (OLEDs) and OSCs. An ideal TCE is highly transparent, to allow the maximum transmission of light, and conductive to provide uniform electrical current distribution. In addition to these properties, the TCE should be mechanically and chemically stable and not cause degradation of the active materials it contacts in the device structure. Among many candidates, indium-tin-oxide (ITO) is a highly doped degenerate semiconductor with optical band-gap above 3 eV; these features make ITO both conductive and transparent to wavelengths greater than approximately 400 nm. As a result, ITO is a common material for TCE and shows good performance in organic optoelectronic devices such as OLEDs and OSCs. Though widely used, ITO faces several challenges for low-cost, high performance, large-area, and flexible applications. The price of ITO has increased due to the limited supply of indium and the increasing demand from the rapidly expanding LCD display market. The migration of indium from ITO into an adjacent or nearby organic active material layer can reduce the device performance. Moreover, ITO is not adequate for flexible applications because ITO has poor mechanical strength. There is a need to find alternative materials to replace ITO as a high transparency electrode.

In addition to TCE, another important issue in commercial development of OSC devices pertains to morphology control of organic photoactive material layers. Because the efficient dissociation of the photo-generated excitons and their charge transportation to each electrode through the effective pathways are determined by the nanostructures of electron-donor and acceptor in the photoactive layer, the morphology can directly impact device performance, such as the PCE of solar cells. Thus, improvement of photovoltaic structures is important for the ability to manufacture high efficiency, easily processed, flexible, and low cost polymer based photovoltaic solar cells.

SUMMARY

The present technology includes systems, methods, devices, and compositions that relate to organic photovoltaic cells made using methods that provide bulk heterojunctions that include interpenetrating network domains of organic electron donor and acceptor materials.

Methods of making a photovoltaic material by volatilization of a carrier or solvent through surface encapsulation and induced alignment are provided. In various aspects, the present technology provides inventive methods of forming an organic photovoltaic cells through a process that can be abbreviated as Evaporation of Solvent through Surface ENCapsulation and with Induced ALignment (hereinafter referred to as "ESSENCIAL") of polymer chains in the active organic material layer (bulk heterojunction layer) by applied pressure. Such methods include disposing a liquid precursor between a gas permeable layer and a first electrode, where the liquid precursor includes an organic electron donor material, an organic electron acceptor material, and a carrier. Pressure is applied to the liquid precursor, as disposed between the gas permeable layer and the first electrode, and at least a portion of the carrier is removed through the gas permeable layer to form a solid material comprising the photovoltaic material. The resulting photovoltaic material has interpenetrating network domains of the organic electron donor material and the organic electron acceptor material in a direction normal to a major surface of the first electrode.

Variations of such methods include using a gas permeable layer that has a surface energy greater than a surface energy of the surrounding environment, where the surrounding environment can be air. The interpenetrating network domains of the electron donor material and the electron acceptor material in the photovoltaic material can be substantially uniform as a result of the method. The gas permeable layer can also be removed from the solid material and a second electrode can be applied to at least a portion of the surface of the solid material.

Methods further include making a photovoltaic material by two-step evaporation of solvent through surface encapsulation and induced alignment. Such methods include disposing a first liquid precursor between a first gas permeable stamp and a first electrode. The first liquid precursor includes a first carrier and one of an organic electron donor material and an organic electron acceptor material. The gas permeable stamp includes a nanoscale pattern, such as projections or voids.

Pressure is applied to the first liquid precursor disposed between the first gas permeable stamp and the first electrode and at least a portion of the first carrier is removed through the first gas permeable stamp to form a first solid material. The first gas permeable stamp is then removed from the first solid material leaving an impression of the nanoscale pattern on a surface of the first solid material. A second liquid precursor is disposed on the surface of the first solid material having the impression of the nanoscale pattern. The second liquid precursor includes a second carrier and the other one of the organic electron donor material and the organic electron acceptor material. The second liquid precursor is thus disposed between the surface and a second gas permeable layer, which has a relatively flat surface morphology. Pressure is applied to the second liquid precursor disposed between the second gas permeable layer and the surface of the first solid material having the impression of the nanoscale pattern. The second liquid precursor thus fills and conforms to the impression of the nanoscale pattern formed in the first solid material when the pressure is applied. Further, at least a portion of the second carrier is removed through by the second gas permeable layer, thus forming a second solid material. Together the first and second solid materials define the photovoltaic material.

Particularly advantageous are substantially uniform distribution of first and second solid materials (e.g., electron acceptor and donor materials) in a vertical direction. In this manner, the photovoltaic material includes interpenetrating network domains (e.g., vertically oriented network domains) of the organic electron donor material and the organic electron acceptor material in a direction normal to a major surface of the first electrode. In certain aspects, a second electrode can be disposed over the second solid material. Further, in certain aspects, the nanoscale pattern of the first gas permeable stamp includes voids and the impression of the nanoscale pattern on the surface of the first solid material that includes nanopillars.

Additionally, in certain variations of the two-step process, a first carrier and a second carrier can also be different from one another. For example, one can be aqueous and the other nonaqueous. In certain variations, it is desirable that the two carriers are orthogonal solvents for the electron donor and electron acceptor materials.

The present technology also contemplates methods of making a photovoltaic material by two-step evaporation of solvent through surface encapsulation and induced alignment, where the photovoltaic material is designed to include a light trapping feature. Thus, in such an embodiment, the second gas permeable stamp used for the second evaporation step has surface topographies (e.g., in the form of periodic grids). Such topographies, when imprinted into the second material (e.g., electron acceptors) during the second evaporation step and over-coated with metal electrode, can produce the light trapping effect desirable for thin film solar cells to improve light absorption by the organic semiconductors.

Such methods include disposing a first liquid precursor between a first gas permeable stamp and a first electrode. The first liquid precursor includes a first carrier and one of an organic electron donor material and an organic electron acceptor material. The gas permeable stamp defines a first nanoscale pattern, which may include projections and/or voids. Pressure is applied to the first liquid precursor disposed between the first pattern of the gas permeable stamp and the first electrode, so that at least a portion of the first carrier is removed by the first gas permeable stamp to form a first solid material. The first gas permeable stamp is then removed from the first solid material leaving an impression of the nanoscale pattern thus forming a first patterned surface on the first solid material. A second liquid precursor is then disposed between the exposed surface of the first solid material and a second gas permeable layer. The second gas permeable layer defines a second pattern, which can include projections and/or voids. The second pattern is preferably distinct from the first pattern. In certain variations, the second pattern may have a surface topology that can create an impression and patterned surface in the second material that creates a light trapping feature, for example, in the form of periodic grids having dimensions of a scale corresponding to the wavelengths of light.

Pressure is applied to the second liquid precursor disposed between the second pattern of the gas permeable stamp and the exposed surface of the first solid material, so that at least a portion of the second carrier is removed by the second gas permeable stamp to form a second solid material. The second gas permeable stamp is then removed from the second solid material leaving an impression of the second nanoscale pattern on an exposed surface of the second solid material. A second electrode material can then be applied over this exposed patterned surface of the second solid material. In this manner, a light trapping feature can be created between the second solid material and the second electrode, which improves light absorption by the organic semiconductor material (e.g., the photovoltaic materials defined by the first and second solid materials). Further, the photovoltaic material comprises interpenetrating network domains of the organic electron donor material and the organic electron acceptor material in a direction normal to a major surface of the first electrode.

The present technology further includes various photovoltaic materials made according to these methods as well as various organic solar cells comprising one or more photovoltaic materials made according these methods.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1. (a) Schematic of the ESSENCIAL process of the present technology for fabricating polymer solar cells: (a1) applying blend solution; (a2) active layer formation during solvent evaporation under pressure; and (a3) isolated island-type electrode deposition on top of polymer blend film after removing the polydimethylsiloxane (PDMS) stamp. (b) Roll-to-roll processing for polymer solar cells: (b1) schematic of a roll-to-roll process for polymer solar cell fabrication; (b2) schematic to depict the squeezed flow behavior of solution during dynamic roll-to-roll process, where the thickness of the liquid coating can be affected by concentration of solution, roller pressure, and rolling speed according to the dynamic elastic contact model; and (b3) a photograph of the roll-to-roll apparatus and process, where the inset image is the resultant flexible polymer solar cell before electrode deposition.

FIG. 2. Characteristics of bulk heterojunction structures obtained by different processing methods. Circle, square, diamond, and triangle represent the blend films made by spin-casting, thermal annealing, solvent-assisted annealing, and the ESSENCIAL process (prepared in accordance with the present technology), respectively. (a) Absorption spectra of the blend films. The spectra have been normalized to the PCBM peak around 325 nm. (b) Weight ratio of PCBM to P3HT calculated by X-ray photoelectron spectroscopy (XPS) results for different processing methods. The error bars represent standard deviation. (c) Measured $\log_J$-$\log_V$ plots under dark condition for hole-and electron-only devices. Symbols are experimental data and lines are the fit to the experimental data by SCLC model showing linear line with slope=2 at the log scale. Open symbols and dotted lines represent further thermally annealed results. The applied bias voltage is corrected for the built-in potential due to the difference in work function of the two electrodes. Insets are schematics of the device structures: (c1) hole-only devices and (c2) electron-only devices. (d) Photoluminescence spectra of blend films. An ESSENCIAL sample prepared in accordance with the present teachings is further treated by heat: filled symbols and lines represent experimental data and their polynomial regressions, respectively. (e) Atomic force microscope phase images. The images in (e1)-(e3) correspond to solvent-assisted annealed sample, thermal annealed sample, and heat-treated ESSENCIAL sample, respectively. The white scale bars represent 50 nm.

FIG. 3. Device performances for devices formed by different processing methods are shown. Symbols are as in FIG. 2 and an inverse triangle symbol is added for devices made by the roll-to-roll process. All data are measured at AM 1.5 G/100 mW cm$^{-2}$ (a) J-V plots. (b) External quantum efficiency. (c) Power conversion efficiency (PCE) and short circuit current density ($J_{sc}$). The error bars represent standard deviation. (d) Fill factor (FF) and series resistance ($R_s$). Average solar cell characteristics are summarized as follows: spin-casting ($J_{sc}$=6.83 mA cm$^{-2}$, $V_{oc}$=0.65 V, FF=62%, $R_s$=14.5 Ω cm$^2$, PCE=2.62%); thermal annealing ($J_{sc}$=8.34 mA cm$^{-2}$, $V_{oc}$=0.61V, FF=65.1%, $R_s$=3.3 Ωcm$^2$, PCE=3.30%); solvent-assisted annealing ($J_{sc}$=10.37 mA cm$^{-2}$, $V_{oc}$=0.58 V, FF=67%, $R_s$=2.0 Ωcm$^2$, PCE=3.95%); heat treated ESSENCIAL ($J_{sc}$=11.48 mA cm$^{-2}$, $V_{oc}$=0.60 V, FF=69%, Rs=1.2 S2 cm$^2$, PCE=4.56%); roll-to-roll ($J_{sc}$=11.30 mA cm$^{-2}$, $V_{oc}$=0.60 V, FF=67%, $R_s$=1.4 Ωcm$^2$, PCE=4.49%). The solar cells are fabricated by roll-to-roll processing and prepared without a PEDOT:PSS buffer layer.

FIG. 4. A two-step ESSENCIAL process according to the present technology is represented, including; (a) A first ESSENCIAL process using gas-permeable nanohole type stamp, (b) high-aspect ratio nanopillar in conjugated polymer electron-donor material, (c) a second ESSENCIAL process using gas-permeable flat stamp to form uniform acceptor layer, (d) ideal interdigitated heterojunction formation, and (e) aluminum/LiF electrode deposition.

FIG. 5. An alternative two-step ESSENCIAL process according to the present technology is represented, including; (a) A first ESSENCIAL process using gas-permeable nanohole type stamp, (b) high-aspect ratio nanopillar in conjugated polymer electron-donor material, (c) a second ESSENCIAL process using gas-permeable stamp defining a second patterned surface to form a uniform acceptor layer that defines a second patterned surface, (d) ideal interdigitated heterojunction formation, and (e) aluminum/LiF electrode deposition, so that a light trapping feature is created between the second patterned surface and the aluminum/LiF electrode.

FIG. 6. Scanning electron microscope (SEM) image of gas-permeable PDMS stamp having 20 nm size nanoholes.

FIG. 7. SEM images of high aspect ratio conjugated polymer nanopillars formed in accordance with the present technology: (a) P3HT nanopillars and (b) PCDTBT nanopillars.

Figure 8:
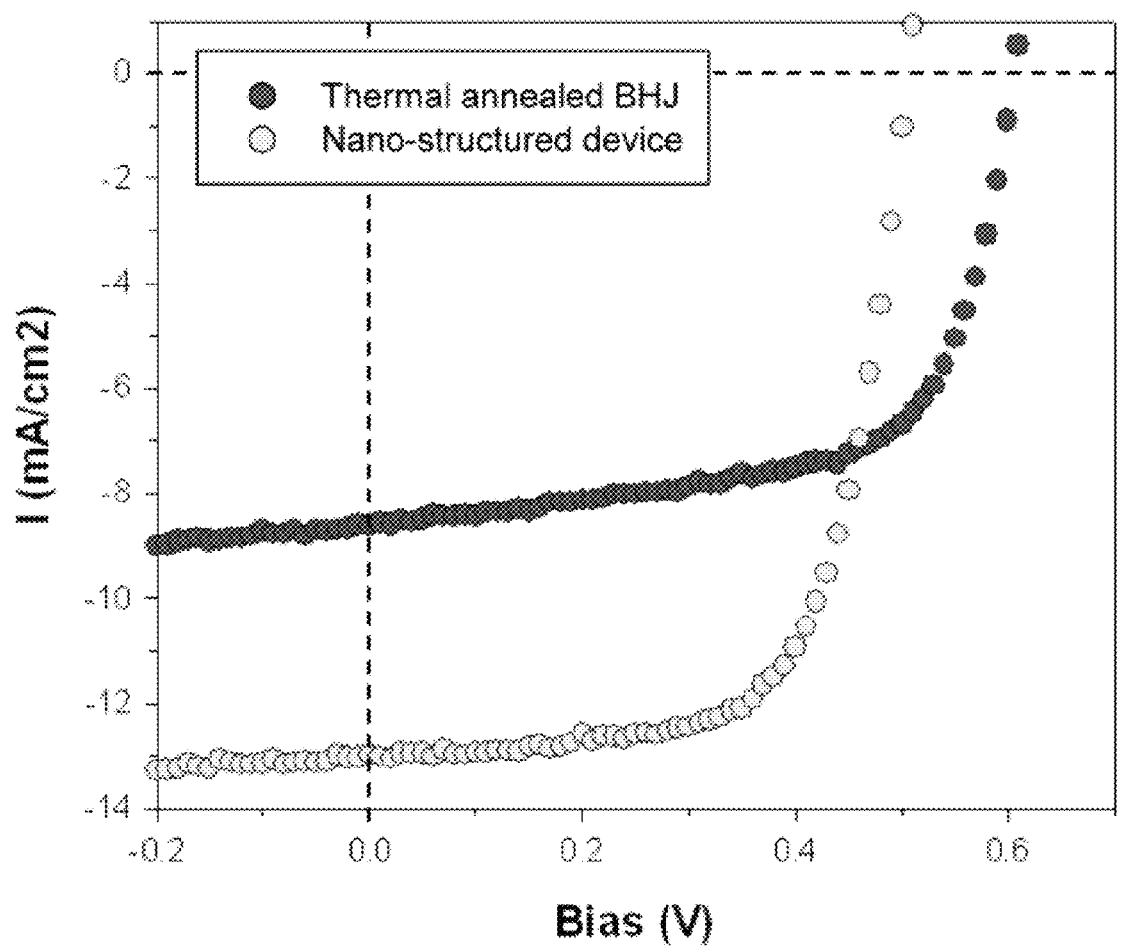

FIG. 8. Current density versus bias plots of OPV devices composed of P3HT:PCBM. All data were measured at AM 1.5 G with an intensity of 100 mW cm$^{-2}$. Average solar cell characteristics such as short circuit current density ($I_{sc}$), open circuit voltage ($V_{oc}$), fill factor (FF) and power conversion efficiency (PCE) are summarized as follows: thermally annealed BHJ device ($I_{sc}$=8.63 mA cm$^{-2}$, $V_{oc}$=0.61V, FF=63.5%, PCE=3.35%); nanostructured device ($I_{sc}$=13.02 mA cm$^{-2}$, $V_{oc}$=0.51V, FF=66.5%, PCE=4.41%).

Figure 9:
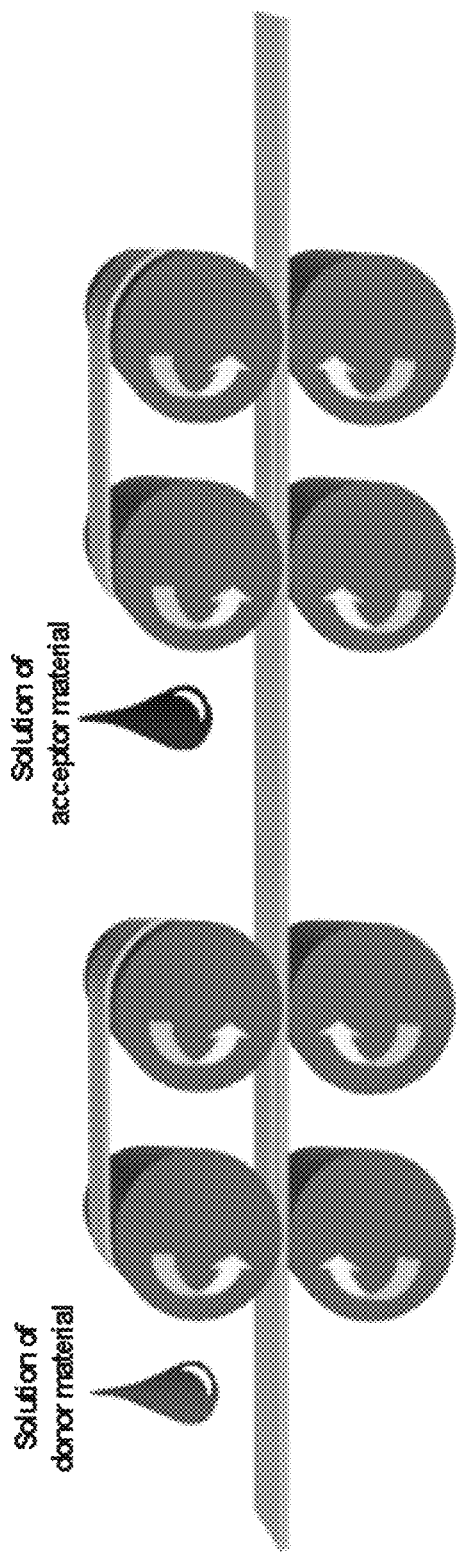

FIG. 9. The extension of two-step ESSENCIAL process to high speed roll-to-roll process.

Figure 10:
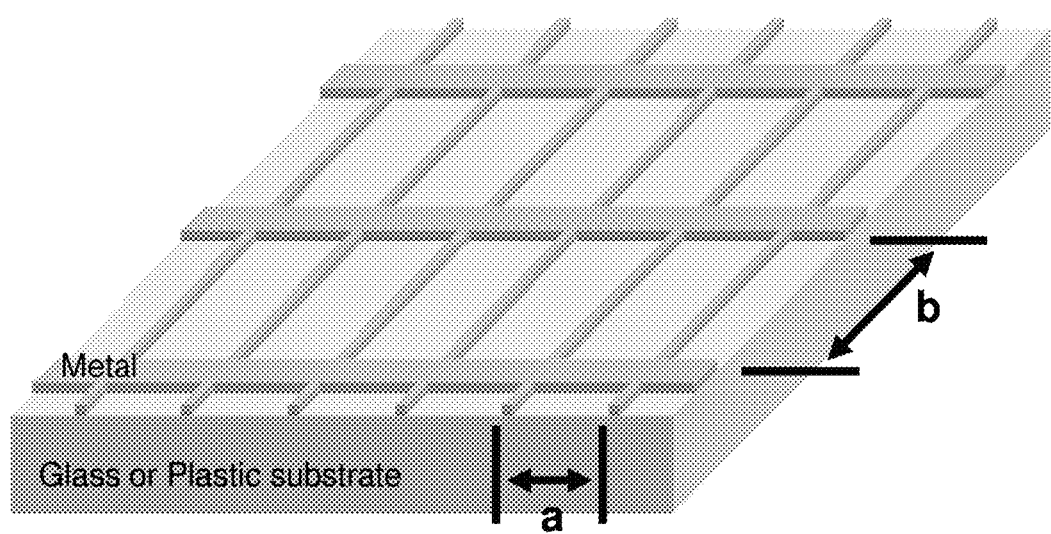

FIG. 10. Schematic of transparent metal electrodes (TCE), where "a" is the main grating for the transparent metal electrode and "b" is the secondary grating for electrical connectivity of main grating "a."

Figure 11:
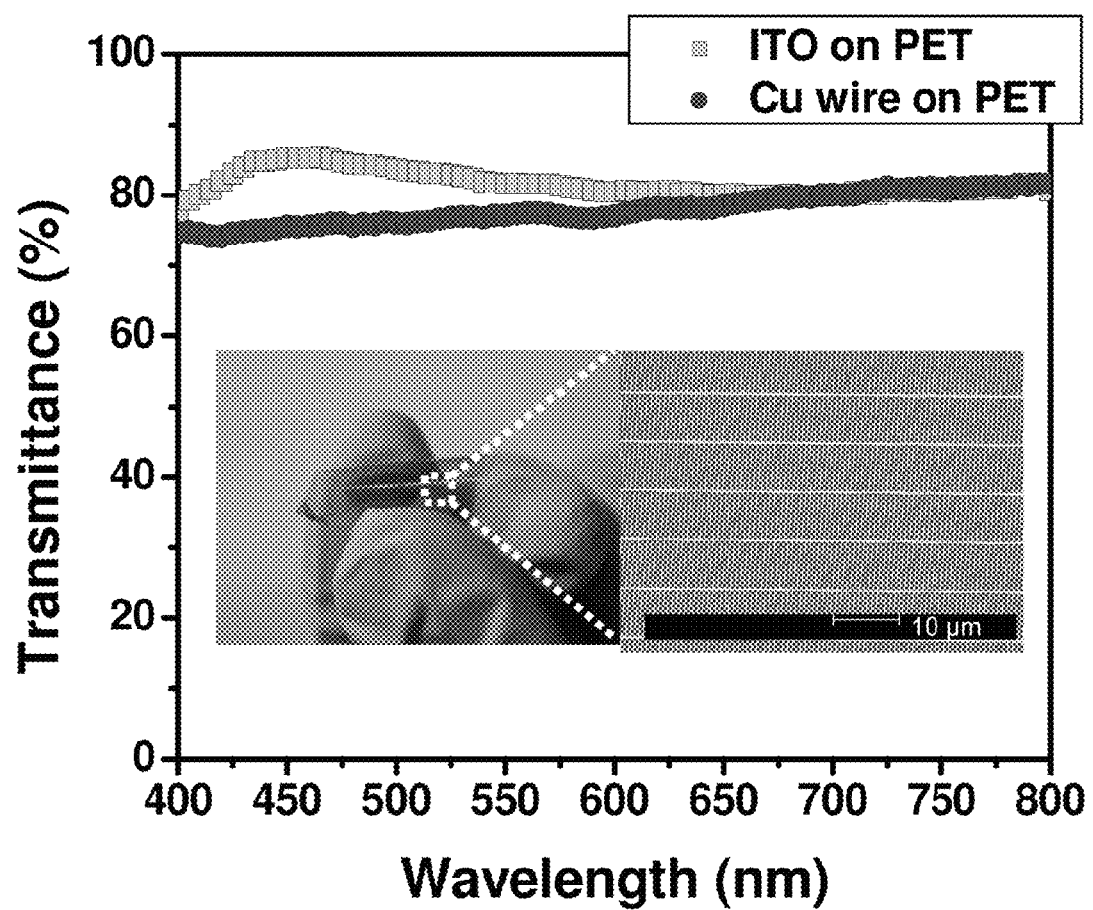

FIG. 11. Optical transmittance spectra of ITO electrode and Cu mesh electrode on PET substrate. Inset: a photograph and SEM image of the high transparency Cu mesh electrode.

Figure 12:
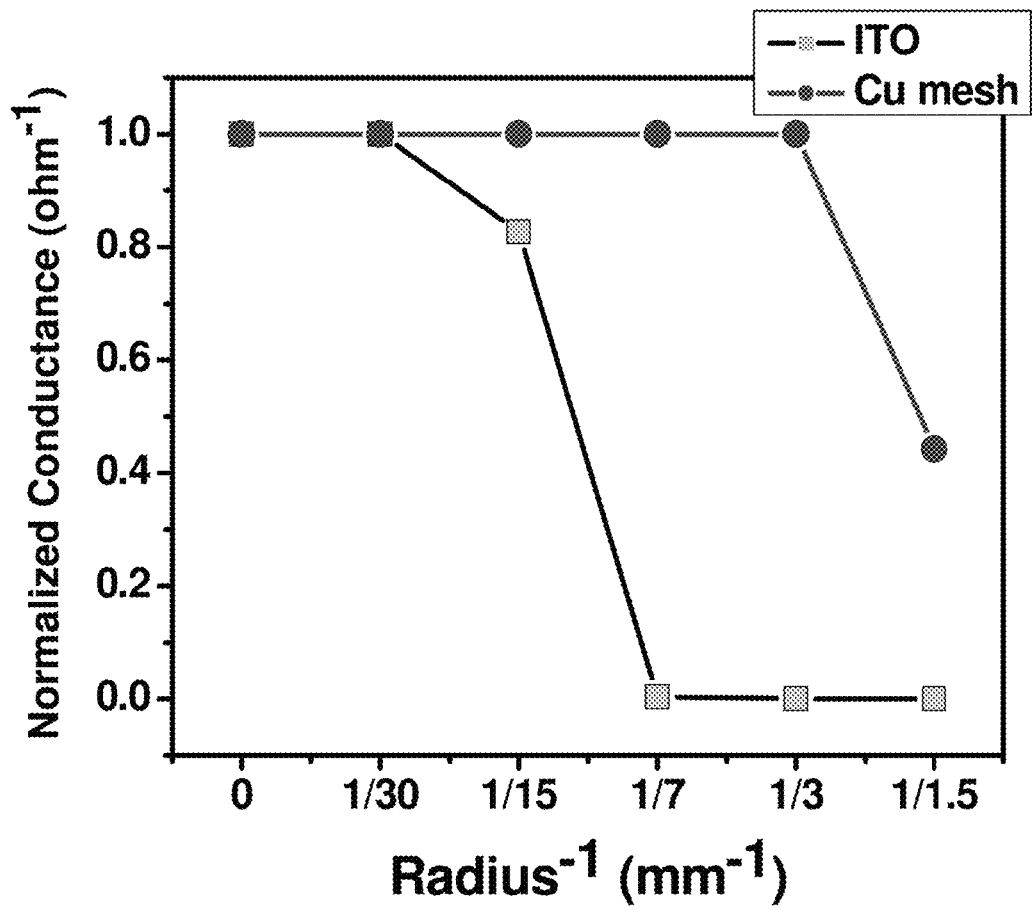

FIG. 12. Normalized conductance vs. inverse of the radius of curvature of the Cu mesh and the ITO electrode.

Figure 13:
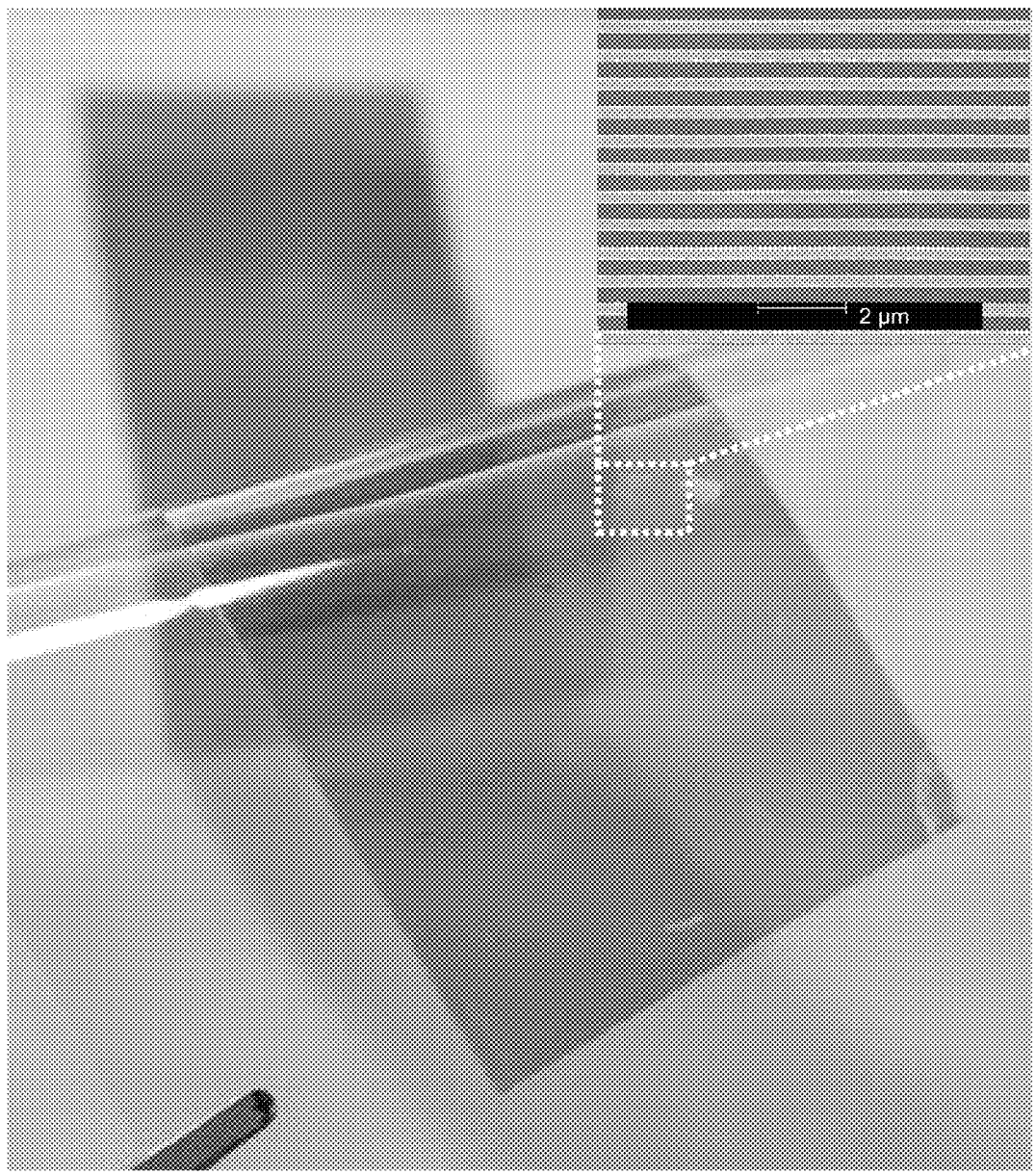

FIG. 13. A photograph of large area (32 mm×184 mm) Au nanogratings fabricated by roll-to-roll process. Inset: A SEM image of fabricated Au nanogratings.

Figure 14:
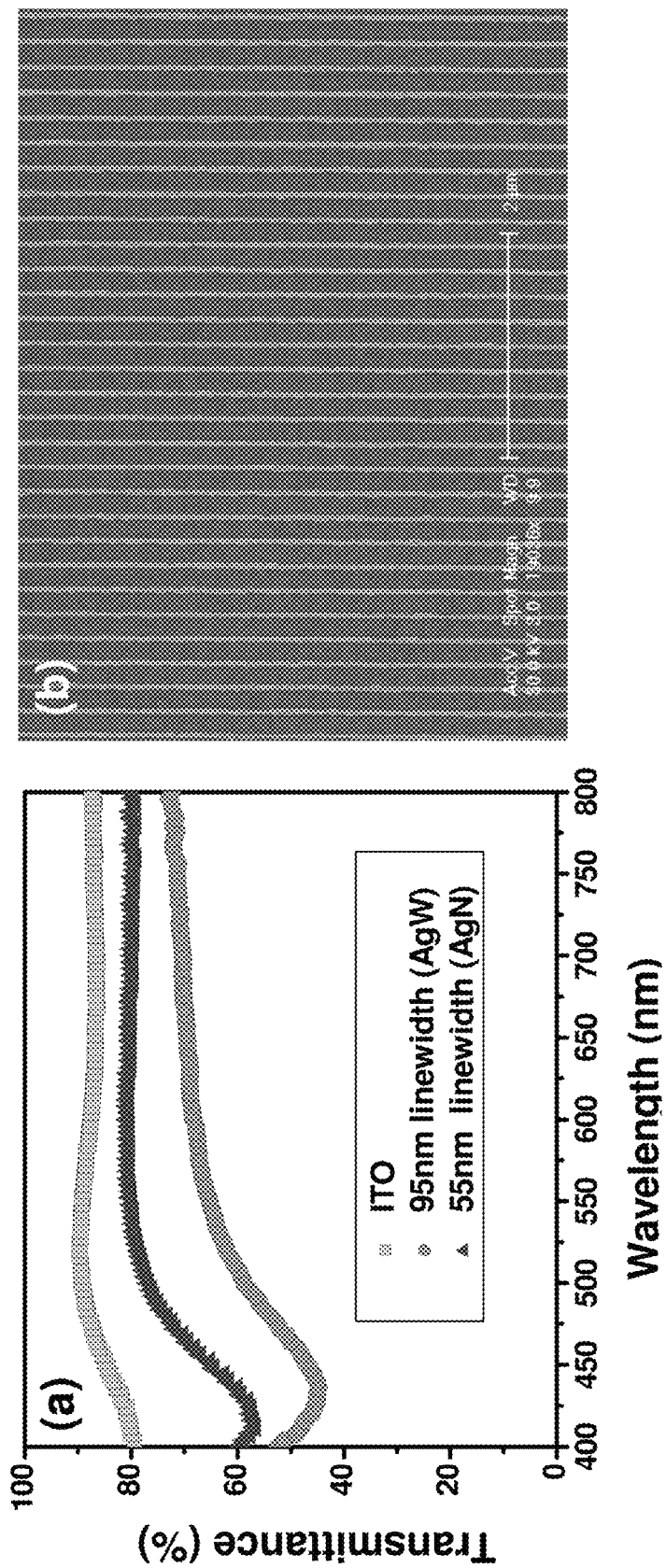

FIG. 14. (a) Optical transmittance of the ITO, AgW and AgN electrode. (b) A SEM image of the AgN electrode.

Figure 15:
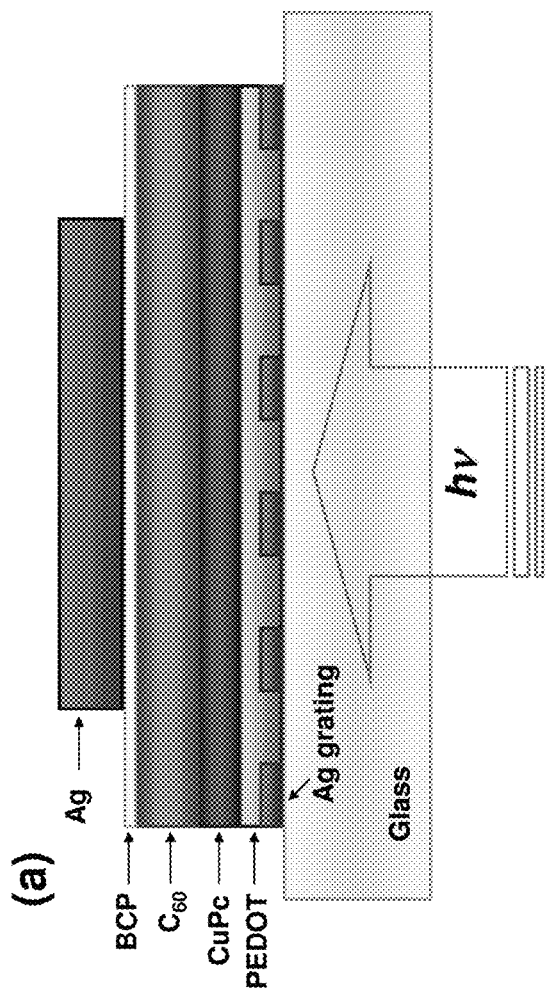

FIG. 15. (a) Schematic and (b) SEM image (without Ag cathode) of the fabricated device.

FIG. 16. (a) Jsc vs. thickness of the organic layer of the devices fabricated and (b) J-V curves of the device #4 in which AgN device exhibited highest enhancement of the Jsc and overall PCE.

Figure 17:
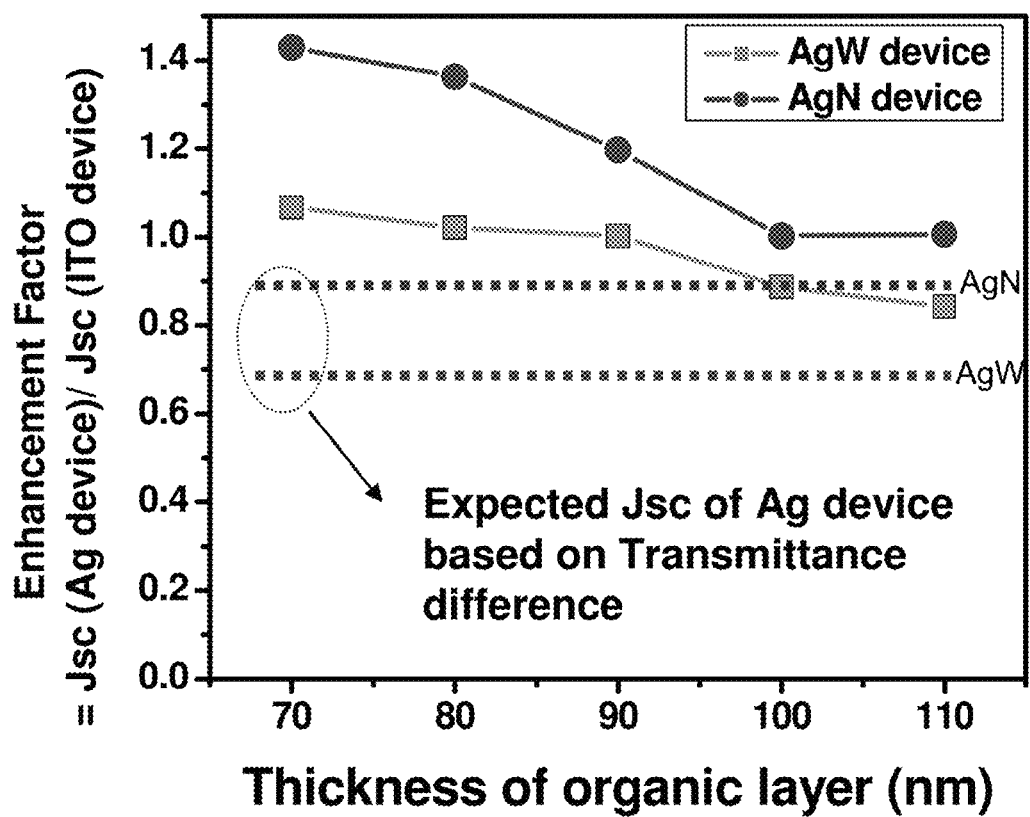

FIG. 17. Enhancement factor vs. thickness of the organic layers. Dotted lines show the expected Jsc of the Ag device based on the transmittance of each electrode without absorption enhancement.

FIG. 18. (a) Measured EQE spectra of the ITO, AgW, and AgN device in case of 80 nm thick organic layers (device #4) and (b) EQE enhancement factor of the AgW and AgN device as referenced to the ITO device. The scattered data points around 800 nm may be due to the low EQE in the ITO control device, which is magnified by the numerical divisions.

FIG. 19. Calculated maps of optical absorption enhancement for nanowire device compared with ITO devices for (a) transverse-magnetic (TM) light (b) transverse-electric (TE) polarized light. (c) Solar irradiance for the standard AM1.5 spectrum. (d) Simulated optical absorption enhancement integrating TM and TE illuminations for nanowire device with 220 nm period. Simulated electric field profiles of nanowire device (e) and ITO device (f) at the wavelength 530 nm for TM illuminations, and nanowire device (g) and ITO device (h) for TE illuminations at 530 nm. All profiles are in the same color scales. The thickness of PEDOT, CuPc, $C_{60}$ and BCP layer is 30 nm, 16 nm, 26 nm and 8 nm, respectively.

DETAILED DESCRIPTION

The following description of technology is merely exemplary in nature of the subject matter, manufacture and use of one or more inventions, and is not intended to limit the scope, application, or uses of any specific invention claimed in this application or in such other applications as may be filed claiming priority to this application, or patents issuing therefrom. A non-limiting discussion of terms and phrases intended to aid understanding of the present technology is provided at the end of this Detailed Description.

The headings (such as "Introduction" and "Summary") and sub-headings used herein are intended only for general organization of topics within the present disclosure, and are not intended to limit the disclosure of the technology or any aspect thereof. In particular, subject matter disclosed in the "Introduction" may include novel technology and may not constitute a recitation of prior art. Subject matter disclosed in the "Summary" is not an exhaustive or complete disclosure of the entire scope of the technology or any embodiments thereof. Classification or discussion of a material within a section of this specification as having a particular utility is made for convenience, and no inference should be drawn that the material must necessarily or solely function in accordance with its classification herein when it is used in any given composition.

The description and specific examples, while indicating embodiments of the technology, are intended for purposes of illustration only and are not intended to limit the scope of the technology. Moreover, recitation of multiple embodiments having stated features is not intended to exclude other embodiments having additional features, or other embodiments incorporating different combinations of the stated features. Specific examples are provided for illustrative purposes of how to make and use the compositions and methods of this technology and, unless explicitly stated otherwise, are not intended to be a representation that given embodiments of this technology have, or have not, been made or tested.

As used herein, the words "desire," "desirable," "preferred," or "preferable" refer to embodiments of the technology that afford certain benefits, under certain circumstances. However, other embodiments may also be desirable, under the same or other circumstances. Furthermore, the recitation of one or more desired embodiments does not imply that other embodiments are not useful, and is not intended to exclude other embodiments from the scope of the technology.

As used herein, the word "include," and its variants, is intended to be non-limiting, such that recitation of items in a list is not to the exclusion of other like items that may also be useful in the materials, compositions, devices, and methods of this technology.

Similarly, the terms "can" and "may" and their variants are intended to be non-limiting, such that recitation that an embodiment can or may comprise certain elements or features does not exclude other embodiments of the present technology that do not contain those elements or features.

Although the open-ended term "comprising," as a synonym of non-restrictive terms such as including, containing, or having, is used herein to describe and claim embodiments of the present technology, embodiments may alternatively be described using more limiting terms such as "consisting of" or "consisting essentially of." Thus, for any given embodiment reciting materials, components or process steps, the present technology also specifically includes embodiments consisting of, or consisting essentially of, such materials, components or processes excluding additional materials, components or processes (for consisting of) and excluding additional materials, components or processes affecting the significant properties of the embodiment (for consisting essentially of), even though such additional materials, components or processes are not explicitly recited in this application. For example, recitation of a composition or process reciting elements A, B and C specifically envisions embodiments consisting of, and consisting essentially of, A, B and C, excluding an element D that may be recited in the art, even though element D is not explicitly described as being excluded herein.

As referred to herein, all compositional percentages are by weight of the total composition, unless otherwise specified. Disclosures of ranges are, unless specified otherwise, inclusive of endpoints and include all distinct values and further divided ranges within the entire range. Thus, for example, a range of "from A to B" or "from about A to about B" is inclusive of A and of B. Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that Parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if Parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

"A" and "an" as used herein indicate "at least one" of the item is present; a plurality of such items may be present, when possible. "About" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters.

When an element or layer is referred to as being "on," "engaged to," "connected to" or "coupled to" another element or layer, it may be directly on, engaged, connected or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Example embodiments and experimental details are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. Equivalent changes, modifications, and variations of some embodiments, materials, compositions and methods can be made within the scope of the present technology, with substantially similar results.

The present technology includes methods and devices formed using such methods relating to organic photovoltaic materials where polymer alignment is induced by solvent evaporation following encapsulation of the polymer. A photoactive material for a photovoltaic device, such as an organic solar cell, is formed using an organic liquid precursor such as a blend solution. The precursor liquid includes the precursors of the components that will form the polymeric active layer and may include, by way of non-limiting example, a carrier/solvent (the term "carrier," as used herein encompasses both solvent and carriers), as well as a precursor of an electron donor material and a precursor of an electron acceptor material. The liquid precursor can include an electron donor, an electron acceptor, and a liquid carrier or solvent.

In accordance with the present technology, a novel method of forming a photoactive material, such as a photovoltaic material for an organic photovoltaic cell, is provided. In such methods, Evaporation of Solvent through Surface ENCapsulation with Induced ALignment (hereinafter referred to as "ESSENCIAL") of polymer chains occurs in the active organic material layer (bulk heterojunction layer) by applied pressure. The present fabrication methods can achieve optimized morphologies of photoactive layers, especially for polymer solar cells, and can be used in making high efficiency solar cells.

The liquid precursor is applied to a substrate, which can include an electrode, such as a transparent conductive electrode or transparent metal electrode. In certain aspects, a buffer layer may be provided on the substrate over an electrode to which the liquid precursor is applied. In various aspects of the ESSENCIAL process, a gas-permeable contact layer covers the free surface of an applied organic precursor liquid. For example, a first gas permeable layer can contact the organic liquid precursor. Pressure is applied thereto to encapsulate the precursor between the substrate and the gas permeable contact layer. A substantial portion of carrier or solvent is removed to form a solid material and form a photoactive material having interpenetrating network domains of electron donor/acceptor materials in a direction normal (i.e., perpendicular) to a major surface of the substrate. The contact layer can then be removed from the solid material. In certain preferred aspects, the network is substantially uniform. Methods and devices can further include forming and/or using a transparent conducting electrode by forming a nanograte of conducting material, such as metal. The methods and devices produced thereby are adaptable to continuous processing techniques, such as roll-to-roll manufacturing.

The use and presence of the gas-permeable contact layer (e.g., cover layer) for carrier/solvent evaporation during processing concurrently protects the otherwise free surface and induces shear flow of the organic precursor blend solution by an applied pressure. The process can lead to an optimized morphology, more uniform distribution of the respective electron donor/acceptor components, and provide a crystallinity of the components that is favorable for charge generation and transportation, which cannot be achieved by conventional TA, SAA, or roll-to-roll methods. Further, in certain variations, the gas permeable contact layer may define a patterned surface that can thus create a pattern in the precursor blend that is solidified.

The present technology further provides fabrication methods and devices including active organic semiconductor materials, such as polymer organic photovoltaic or polymer solar cells. The methods of the present disclosure are scalable to large area and high speed roll-to-roll processes for industrial and commercial production. In certain aspects, the methods of the present disclosure employ a gas permeable contact layer, such as a gas permeable silicone film, which permits a carrier (including a solvent or suspending phase) to volatilize. Upon application of pressure, the gas permeable contact layer induces shear flow to organize polymer chains within an organic precursor during polymer crystallization. In accordance with various aspects of the present disclosure, favorable donor-acceptor morphology shows well-organized photo-induced charge transporting pathways with fine nano-domains and high crystallinity. Photovoltaic cells, such as organic solar cells, fabricated by the methods of the present disclosure, including techniques such as roll-to-roll continuous processes, can possess improved device performance as compared with control samples made by conventional thermal and solvent-assisted annealing methods.

In yet other aspects, the present technology pertains to methods to produce low-cost, highly efficient organic photovoltaic cells, such as organic solar cells (OSCs), with transparent conductive electrodes having enhanced functionalities and scalable and high-speed processing methods of the organic active/semiconductor materials. In some embodiments, transparent conductive electrode is a transparent metal electrode. As appreciated by those of skill in the art, the description herein pertains to polymer organic solar cells; however, the technology may be applicable to a variety of conjugated polymer based semiconductor materials and device structures incorporating the same.

Conventional techniques of forming semiconductor active materials, such as bulk polymeric heterojunction structure (BHJ) active materials, include thermal annealing (TA) and solvent-assisted annealing (SAA) treatments (e.g., after spin-casting a blend film) to control the blend morphology for high efficiency polymer solar cells. Such polymer bulk heterojunction (BHJ) structures have been exploited to provide the highest efficiencies thus far for polymer photovoltaic (PV) cells, including for OSCs. The BHJs include interpenetrating nanoscale networks of electron-donor (e.g., conjugated polymers) and electron-acceptor (e.g., soluble fullerene derivatives) with domain sizes on the order of an exciton diffusion length (e.g., about 4-20 nm) and with large interfacial areas between the domains. Such a network can therefore facilitate efficient dissociation of photo-induced excitons at the domain interface. Thus, BHJ organic photovoltaic cells are candidates for forming high efficiency polymer solar cells on a large, commercial scale.

With current processes for forming a BHJ polymer photovoltaic cell, such as spin-casting or conventional roll-to-roll processing, randomly distributed blend morphologies in BHJ structures inevitably require external treatment, such as heat application for annealing, to enhance pathways for the photo-generated charges to reach each electrode. After formation of the blend film, these annealing treatments can be used to provide better organization of interpenetrating networks composed of highly crystallized components. However, even with such post-formation annealing, it appears that a phase separation of components can still occur in a vertical direction (i.e., normal to a major surface of the film and the electrode surface disposed below the active material) where BHJ structures fabricated by these methods do not have optimized morphology.

The conventional annealing processes used with TA and SAA also require relatively long processing times (e.g., tens of minutes for TA or a few hours for SAA) and spin-casting deposition can only be applied to small and rigid substrates, making these approaches unsuitable for practical large area and mass production of polymer solar cells. Even though high-speed fabrication processes on flexible substrates can be used to form photovoltaic devices (roll-to-roll) via conventional techniques, the efficiency and performance of such devices is inferior to those formed by spin-casting polymer solar cells, followed by further post-treatments. This is because conventional high speed roll-to-roll coating methods do not appear to provide sufficient annealing time for crystallization and hence result in lower device efficiency.

Accordingly, optimizing blend morphology to provide effective charge pathways, as well as techniques to increase interfacial area, are important to achieve high efficiency polymer solar cells using BHJ structures. BHJ and/or TCE structures are important for the ability to manufacture high efficiency, easily processed, flexible, and low cost polymer based photovoltaic solar cells.

The methods and devices of the present technology provide optimized morphologies of photoactive layers, especially for polymer solar cells, and can be used in making high efficiency solar cells. More specifically, the inventive technology provides the ability to create substantially uniform distribution of electron acceptor and donor materials, especially in a vertical direction (orthogonal to the electrodes). In this manner, the photovoltaic material formed in accordance with the present teachings desirably includes interpenetrating network domains (e.g., vertical network domains) of the organic electron donor material and the organic electron acceptor material in a direction normal to a major surface of the first electrode. In certain aspects, the electron donor and electron acceptor can be patterned on a nano-scale to further improve the morphology and distribution of the materials in the photovoltaic active layer. For example, the photovoltaic layer can define interpenetrating or alternating nanopillars of the electron donor and acceptor that are intimately in contact with one another to provide photovoltaic cells having superior performance and high efficiency.

Comparisons among devices and structures fabricated by the present methods and conventional methods can be made by measuring various parameters including quantum efficiency, absorbance, X-ray photoelectron spectroscopy (XPS), and hole-and electron-mobilities. Furthermore, the effect of domain features of the components on efficient exciton dissociation can be determined using atomic force microscopy (AFM) and photoluminescence (PL). The power conversion efficiency can be obtained by J-V measurement based on isolated cathode geometry in order not to overestimate the efficiency commonly occurring in devices by using cross-bar electrode geometry. Results of such measurements, as presented in the example embodiments described herein, indicate that methods and devices employing the ESSENCIAL process not only have more uniformly distributed interpenetrating continuous pathways with finer nanodomains and high crystallinity, but also demonstrate the ESSENCIAL process is applicable to high-speed dynamic methods, which are demonstrated herein by a roll-to-roll process, while at the same time preserving high performance of the fabricated devices.

In an example system, a conjugate polymer blend of poly (3-hexylthiophene) (P3HT):[6,6]-phenyl $C_{61}$ butyric acid methyl ester (PCBM) is used as a BHJ blend morphology. In such a system formed by conventional processing, a non-uniform vertical distribution exists with a P3HT phase dominant near the cathode electrode and a PCBM phase dominant near the anode. Such non-uniform distribution is not an ideal solar cell structure, where the ideal structure would have a donor rich phase (e.g., P3HT) near the anode and an acceptor rich phase (e.g., PCBM) near the cathode, and therefore the morphology created by conventional processing is unfavorable to charge transport to the electrodes.

An embodiment of the ESSENCIAL process is depicted in FIG. 1(a), where a photovoltaic material is made by volatizing a carrier through surface encapsulation and induced alignment. First, an electrode assembly, such as anode assembly 100 is provided that includes a substrate layer and an electrode, like an indium tin oxide anode. In the embodiment shown in FIG. 1(a)(1), a buffer layer 110 is provided over the anode assembly 100 comprising poly(3,4-ethylenedioxythiophene):poly(styrenesulfonate) (PEDOT:PSS), for example. Next, the method includes disposing a liquid precursor 120 between a gas permeable layer 122, such as modified polydimethylsiloxane stamp and the anode 100. The liquid precursor 120 comprises an organic electron donor material, such as poly(3-hexylthiophene) (P3HT), an organic electron acceptor material, such as [6,6]-phenyl C61 butyric acid methyl ester (PCBM), and a conventional carrier or solvent. While not limiting the present disclosure to any particular organic material system, for purposes of illustration, a conjugate polymer system of poly(3-hexylthiophene) (P3HT):[6,6]-phenyl $C_{61}$ butyric acid methyl ester (PCBM) is used to demonstrate optimized BHJ blend morphology. A P3HT:PCBM blend is used as a model system, so that an organic liquid precursor (also referred to herein as a "blend solution," although notably the organic liquid precursor need not be only in solution) is placed on a transparent anode substrate and capped with a gas-permeable contact layer (e.g., gas permeable silicone film for purposes of the following examples) where pressure is then applied.

Thus, as shown in FIG. 1(a2), the method includes applying pressure to the liquid precursor 120 disposed between the gas permeable layer 122 and the first electrode 100. At least a portion of the carrier/solvent in the liquid precursor is removed through the gas permeable layer 122 to form a solid photovoltaic material 140 comprising interpenetrating network domains (not shown) of the organic electron donor material and the organic electron acceptor material in a direction normal to a major surface of the first electrode (direction designated "A" in FIG. 1 (a3)). Thus, in accordance with the present techniques, interpenetrating network domains of the electron donor material and the electron acceptor material can be formed that are substantially uniform in the vertical direction normal to the substrate surface ("A"). Without being limited by theory, it is believed that the resultant induced shear assists with aligning the polymer chains while the solvent evaporates through the silicone film. The solidified blend layer or solid photoactive material 140 remains on the substrate 100 after removing the silicone film 122. Interestingly, it has been surprisingly discovered that the buffer layer 110 widely used on top of a transparent anode 100 in organic photovoltaic devices, is not necessary in certain photovoltaic devices formed in accordance with the present technology, such as by roll-to-roll application. Thus, in certain embodiments, the buffer layer 110 may be included over the anode 100, but in other embodiments, the buffer layer 110 can optionally be omitted from the photovoltaic cell structure altogether. The thickness of the photovoltaic active layer 140 can be controlled by adjusting the solution concentration in the liquid precursor 120 and the applied pressure, and the evaporation and solidification time can be reduced to a few seconds by controlling the applied pressure. Finally, a cathode 130 can be disposed on a portion of the photovoltaic active solid layer 140. As shown in FIG. 1(a3), the cathode is an assembly comprising a first layer of LiF and a second layer of aluminum.

In certain aspects of the present disclosure, a roll-to-roll apparatus 200 can be used to conduct an ESSENCIAL process similar to the one described in FIG. 1(a), including use of the same exemplary materials. The roll-to-roll apparatus 200 is composed of dual rollers 230, back roller 232, and a tensioned belt 234 covered with a gas permeable contact layer 214 (e.g., a gas-permeable silicone film). An organic liquid precursor (e.g., polymer blend like that described in the embodiment of FIG. 1(a)) 212 is applied to a substrate 202 (which can be part of the tensioned belt 234) with a first electrode 210 disposed thereon. The processing in the roll-to-roll apparatus 200 enables coating of the liquid precursor 212 with uniform thickness and fast solvent evaporation in a continuous fashion; see FIG. 1(b).

According to a dynamic elastic contact model for roll-to-roll nanoimprinting (FIG. 1(b2)), the thickness of coated active layer 220 (FIG. 1(b1)) can be controlled by the solution concentration and roller pressure, which is the same condition as the small scale ESSENCIAL embodiment described above. The photovoltaic active layer film 220 uniformity can be preserved by the belt tension during the solvent evaporation process.

FIG. 1(b3) and the inset image show a 3 inch wide uniform BHJ active layer film made of P3HT:PCBM blend on an ITO-coated PET substrate for flexible solar cells using the continuous roll-to-roll process. After about 1 minute of heat treatment, a second electrode, such as a cathode comprising LiF and Al cathode are deposited onto a portion of the photovoltaic active layer 220. A power conversion efficiency (PCE) of about 3.5% is achieved using the ESSENCIAL roll-to-roll process, as shown in FIG. 3.

Various features of devices and systems resulting from the ESSENCIAL process can be compared with the output of conventional methods. For example, the crystallinity of the conjugate polymer (organic active material layer) can be investigated by absorbance spectroscopy (detailed information regarding formation of comparative examples is found in the particular examples described below). The chain ordering of the conjugate polymer in a BHJ structure is important to achieve improved crystallinity for a high efficiency solar cell because the improved organization of polymer chains facilitates hole transport and the long conjugation length enhances the absorption of light resulting in efficient exciton generation. Thus, while not limiting the applicability of the present disclosure, a conjugate polymer with high crystallinity, such as P3HT, is advantageous. The absorption spectrum of the blend film fabricated by the ESSENCIAL method is compared with that made by the spin-casting method in FIG. 2(a). To further evaluate the efficiency of the ESSENCIAL method, the samples treated by TA and SAA after spin-casting, which are generally used to improve the crystallinity of the P3HT, are also examined.

In the ESSENCIAL process, a shear stress is applied to a liquid precursor polymer solution, which results in an increased organization of the polymer(s) across entire depth between the two solid surfaces (e.g., plates) in a much more effective manner than between a solid surface and an air surface (e.g., spin-casting), which is continuously decreased from the plate and subsequently zero at the air interface. Therefore, enhanced vibronic peaks in the absorbance spectra as well as a significant red-shift, which indicate a higher degree of ordering of P3HT chains, are observed in the ESSENCIAL sample. Additionally, the ESSENCIAL processing can be completed in just a few seconds, but the enhancement found in the sample is much higher than that in samples thermally annealed for 20 minutes and is comparable to that of the solvent-assisted annealed sample in which P3HT crystals are slowly grown for 2 hours. Such a property permits the methods of the present disclosure to be applied to a high speed roll-to-roll continuous process to produce well-ordered P3HT domains.

In addition to improved polymer crystallinity, it is desirable that the nanodomains of each blend component are well-connected in order for holes from charge-separated excitons to be effectively transported to the anode and the electrons to the cathode through continuous pathways. However, the non-uniform distribution of the donor and acceptor components found in a spin-cast sample, even after TA or SAA, is not helpful to the effective charge transport to the electrodes. This non-uniform distribution of components in the vertical direction is believed to be a consequence of the surface energy difference between P3HT (26.9 m N m$^{-2}$) and PCBM (37.8 m Nm$^{-2}$), which pushes P3HT to the lower surface energy air surface in order to minimize the overall free energy. In contrast, vertical distributions for films prepared by the ESSENCIAL process are more uniform, because the gas-permeable contact layer can be selected to have a higher surface energy than the surrounding environment; e.g., a gas permeable silicone film effectively provides a higher surface energy than that of the air interface. X-ray photoelectron spectroscopy (XPS) results shown in FIG. 2b clearly illustrate these trends. Though the weight ratio of PCBM to P3HT in the blend solution is 1:1, the weight ratio of PCBM to P3HT of thermal and solvent-assisted annealed samples measured at the top surface are 0.411 and 0.488, respectively, which indicates a large accumulation of P3HT at the top of the film. But the inventive ESSENCIAL sample produced much more balanced value (0.855), which implies more uniform distribution of components in the vertical direction.

In order to confirm that the uniformly distributed components in the ESSENCIAL-treated sample according to the present technology are beneficial to effective charge transport by providing more continuous pathways through the film, hole-only and electron-only devices can be made to evaluate the charge transport properties in the phase-separated blend film. The hole-only device is fabricated by replacing LiF with high work-function molybdenum oxide (MoO$_3$) to block the injection of electrons from the Al cathode. The electron-only device is fabricated by using low work function cesium carbonate (Cs$_2$CO$_3$) to replace PEDOT:PSS to block the hole injection from the ITO anode. Both hole- and electron-mobility are calculated using a space-charge-limited-current (SCLC) model at low voltage:

$$J = \frac{9}{8}\varepsilon_o\varepsilon_r\mu\frac{V^2}{L^3}$$

where $\epsilon_o\epsilon_r$ is permittivity of the component, $\mu$ is the carrier mobility, and L is thickness.

As shown FIG. 2(c1), the hole-mobility of the thermal annealed sample shows the lowest value ($\mu_h$~1.57×10$^{-4}$ cm$^2$ V$^{-1}$ s$^{-1}$) due to relatively poor crystallinity of polymers in such samples. In comparison, the hole-mobility of the ESSENCIAL-treated sample ($\mu_h$~1.15×10$^{-3}$ cm$^2$ V$^{-1}$ s$^{-1}$) is much higher, and also higher than solvent-assisted annealed sample ($\mu_h$~3.29×10$^{-4}$ cm$^2$ V$^{-1}$ s$^{-1}$), even though the two types of samples show similar polymer crystallinity in the absorbance measurement; see FIG. 2(a). This means that the uniformly distributed P3HT polymer domains appear to facilitate the hole transport and the most optimized hole-transporting pathways are obtained in the ESSENCIAL sample across the entire depth of the device.

Further, insufficient crystallinity of P3HT in the thermal annealed sample is believed to be due to rapidly grown large PCBM crystal domains, which hamper crystallization of P3HT. But in a solvent-assisted annealed sample, the mild growth of PCBM provides sufficient time for P3HT to be fully crystallized, leading to more balanced crystalline morphologies of the two domains. Therefore, contrary to the rapidly grown large aggregation of PCBM that produces poor electron pathways and significantly lower electron-mobility in the thermal annealed sample, the well-balanced PCBM pathway developed in the solvent-assisted annealed sample shows higher electron-mobility Cue $4.95\times10^{-4}$ cm$^2$ V$^{-1}$ s$^{-1}$), as shown FIG. 2(c2).

On the other hand, an interesting effect is observed for various samples after further TA—for the ESSENCIAL sample the electron-mobility is drastically increased to the highest value (from $3.61\times10^{-7}$ to $1.46\times10^{-3}$ cm$^2$ V$^{-1}$ s$^{-1}$) but the solvent-assisted annealed sample treated by further TA showed reduced electron-mobility similar to that of thermal annealed sample. While not being limited to any particular theory, it is believed that the PCBM molecules in the ESSENCIAL sample may not be as well organized to form efficient electron pathways before TA, but can be effectively crystallized after TA, and due to the suppression by the uniformly distributed P3HT polymers they are not overgrown to large aggregates even after thermal treatment. Consequently, well-organized PCBM pathways are formed among P3HT polymers to give optimized interpenetrating structures after the thermal treatment. In the case of a solvent-assisted annealed sample, however, non-uniformly accumulated PCBM molecules can easily assemble to large PCBM aggregates due to weaker suppression effect by the P3HT during the TA, which inevitably produces poor electron pathways and results in depletion of PCBM in regions within the network structure.

Additionally, the effects of further heat treatment are not significant to the hole-mobilities of the solvent-assisted annealed sample (from $3.29\times10^{-4}$ to $2.20\times10^{-4}$ cm$^2$ V$^{-1}$s$^{-1}$) and the ESSENCIAL-treated sample (from $1.15\times10^{-3}$ to $1.26\times10^{-3}$ cm$^2$ V$^{-1}$ s$^{-1}$) due to sufficiently crystallized P3HTs obtained under both processing conditions; see FIG. 2(c1). As a result, the most optimized transport pathways for both charge carriers are achieved in the heat-treated ESSENCIAL sample, and well-balanced mobilities ($\mu_e/\mu_h$~1.16) are obtained. Even though the electron-mobilities of thermally annealed devices and solvent-assisted annealed devices with further heat-treatment are not well-matched with SCLC model, the significantly lower expected values ($10^{-8}$~$10^{-7}$ cm$^2$ V$^{-1}$ s$^{-1}$) do not affect any conclusions here. The carrier mobilities depending on different processing methods are summarized in Table 1.

TABLE 1

Calculated carrier mobilities depending on the different processing methods.

| Method | Carrier mobility [$10^{-4}$ cm$^2$ V$^{-1}$ S$^{-1}$] | | |
|---|---|---|---|
| | Electron [$\mu_e$] | Hole [$\mu_h$] | Ratio [$\mu_e/\mu_h$] |
| COMPARATIVE EXAMPLE Spin-Casting & Thermal Anneal (TA) | — | 1.57 | — |
| COMPARATIVE EXAMPLE Spin-Casting & Solvent-Assisted Annealing (SAA) | 4.95 | 3.29 | 1.50 |
| INVENTIVE EXAMPLE ESSENCIAL* | 14.60 | 12.60 | 1.16 |

*ESSENCIAL sample is further treated by heat

Regarding further aspects, domain size in the BHJ structures and effects on exciton quenching can be investigated using atomic force microscopy (AFM) and photoluminescence (PL), as shown in FIGS. 2(d) and 2(e). Compared with the non-uniform mixture, where one phase is dominant at one surface, more uniformly mixed donor and acceptor phases throughout the film are believed to have finer interpenetrating nanodomains that are advantageous to efficient dissociation of photo-generated excitons, and hence result in suppressed PL from the donor polymer. The PL of an annealed sample is enhanced as compared with a spin-cast only film, because the higher crystallinity induced by annealing gives relatively poor exciton dissociation due to the reduction of interfacial area between the donor and acceptor domains. However, the improved charge transport of the annealed samples due to increased crystallinity can offset the poor exciton dissociation effect, still producing relatively good efficiency solar cells. Therefore, the solvent assisted-annealed sample having higher crystallinity than the thermal annealed sample showed well-defined domains in AFM phase images, and this improved crystallinity induced the enhancement of PL as shown in FIG. 2(d). As for the heat-treated ESSENCIAL sample, finer interpenetrating networks than the solvent-assisted annealed sample were obtained due to the more uniform distribution of the blend, and well-defined nanodomains are much more discernable in AFM phase images. These uniformly distributed and fine interpenetrating nanodomains not only permit good charge pathways, but also facilitate the efficient exciton dissociation therefore suppressing the photoluminescence (PL) from the donor, and consequently giving the lowest PL in FIG. 2(d).

Device performances including power conversion efficiency (PCE) and J-V curves can be measured under AM 1.5 G simulated sun light (at 100 mW cm$^{-2}$ intensity), as summarized in FIG. 3. In device fabrication, an isolated island-type metallic cathode is used to exclude the overestimation of the photocurrent commonly occurring in devices using cross-bar type electrodes. For example, PCE can be overestimated as much as by 30%, and can be even higher depending on electrode design and measurement conditions. The devices fabricated by the ESSENCIAL process followed by heat treatment showed the highest PCE due to the optimized domain morphologies and charge pathways that result in both increased short circuit current and fill factor; see FIGS. 3(c) and 3(d). The favorable morphology of devices formed in accordance with the present disclosure also provides the lowest series resistance (~1.2 Ωcm$^2$). The improvement of PCE is confirmed by improved external quantum efficiency (EQE) in the range from 350 nm to 650 nm. The detailed measured values are shown in FIG. 3(b).

Another advantage of the ESSENCIAL process is the ability to eliminate a buffer layer between an anode electrode and the active organic semiconductor material (bulk heterojunction material). For example, a PEDOT:PSS system is one of the most widely used buffer layers (between an ITO anode and the active organic semiconductor) to improve the performance of polymer solar cells. One of the important roles of this PEDOT:PSS layer is to provide efficient electron blocking to prevent electron leakage from the BHJ acceptors. If PEDOT:PSS is not used in devices formed via conventional techniques (e.g., TA or SAA annealed devices after spin-casting), such devices can show a significant drop of fill factor (e.g., from about 65.1% to about 54.8%) that results in a reduction in power conversion efficiency (PCE). However, unexpectedly, a device formed via the ESSENCIAL process, which eliminates a PEDOT:PSS buffer layer, only has a small drop of fill factor (e.g., from about 69.1% to about 67.3%) that results in negligible effect to PCE. This effect is believed to be due to the improved morphology in the ESSENCIAL devices, as described herein. In devices with spin-cast films, large amounts of PCBM are non-uniformly assembled near the ITO anode and electron leakage is induced. However, the uniform distribution of components (e.g., electron donor/acceptor components) in the devices formed via ESSENCIAL process reduces these electron leakage pathways.

Thus, the present technology eliminates the need to employ a PEDOT:PSS buffer layer, which provides an additional benefit by significantly reducing processing time (eliminating both the PEDOT:PSS coating step and the baking step to remove residual $H_2O$ molecules from PEDOT:PSS) as compared to conventional fabrication techniques, and makes the ESSENCIAL process especially suitable for high-speed roll-to-roll processing. The advantages of ESSENCIAL processes to induce superior BHJ morphology in such a short processing time are scalable for high throughput, high efficiency polymer solar cell fabrication. Further description of processing conditions is provided in the example embodiments.

In certain aspects of the present disclosure, polymer solar cells are made via a roll-to-roll apparatus composed of dual rollers and a tensioned belt covered with a gas permeable contact layer (e.g., a gas-permeable silicone film), which enables coating of an organic liquid precursor (e.g., a polymer blend) with uniform thickness and fast solvent evaporation in a continuous fashion; see FIG. 1(b). According to a dynamic elastic contact model for roll-to-roll nanoimprinting (FIG. 1(b2)), the thickness of coated active layer can be controlled by the solution concentration and roller pressure, which is the same condition as the small scale ESSENCIAL experiment as described, and the film uniformity can be preserved by the belt tension during the solvent evaporation process. FIG. 1(b3) and the inset image show a 3 inch wide uniform BHJ active layer film made of P3HT:PCBM blend on an ITO-coated PET substrate for flexible solar cells using the continuous roll-to-roll process. After about 1 minute of heat treatment, LiF and Al cathode are deposited, and a PCE (~3.5%) is achieved using the ESSENCIAL roll-to-roll process, as shown in FIG. 3.

The following example embodiments further describe organic photovoltaic cells having improved bulk heterojunction morphology and the ESSENCIAL process.

Device Fabrication

Polymer PV cells have the following planar configuration: transparent sub strate/ITO/PEDOT:PS S/P3HT:PCBM/LiF/Al. ITO coated substrates (Delta Technologies, LTD) are cleaned in acetone and isopropyl alcohol (IPA) under sonication for 20 min, respectively, and treated by $O_2$ plasma for 60 s. Cleaned substrates are then transferred to a $N_2$ purged glove box and the filtered PEDOT:PSS(H.C. Starck, Clevios PH 500) is spin-cast onto the ITO electrodes to deposit about a 45 nm thick layer which is subsequently heated at 115° C. for 15 min. For the active layer, P3HT (Rieke Metals Inc., 4002-E, ~91% regioregularity) and PCBM (American Dye Source, Purity: >99.5%) are used as received, and blend solutions are prepared by dissolving both components in 1,2-dichlorobenzene with 1:1 ratio by weight. The solution is stirred for ~12 hours in the $N_2$ purged glove box to give homogeneous blend system and filtered using a 0.45 μm filter.

The thermal annealed devices are fabricated by spin-casting blend solution onto the PEDOT:PSS layer for 90 seconds and subsequently annealing at 130° C. for 20 min. After thermal treatment, LiF (1 nm) and Al (80 nm) electrodes are deposited by thermal evaporator at a pressure of $8\times10^{-7}$ mbar through circular-shaped shadow masks with a 3.5 mm diameter. As for the solvent annealed devices, spin-casting time is reduced to 30 seconds to retain a certain amount of residual solvent in the blend film and the sample is immediately covered by glass Petri dish to slowly evaporate the solvent for 2 hours.

The ESSENCIAL process is performed by squeezing a blend solution as described above (P3HT:PCBM in solvent) between a modified PDMS silicone film that is gas-permeable and solvent-resistant with minimal deformation and an ITO substrate coated with PEDOT:PSS. After separating the silicone film, an active material layer in the form of a blend film is baked at 130° C. for 1 minute before further electrode deposition. The effects of thermal treatment time on the device performances of the ESSENCIAL-treated samples are consistent from about 1 to about 20 minutes. The thickness of the active layer fabricated by the ESSENCIAL method is controlled by changing the concentration of P3HT:PCBM solution (from 0.2 wt %:0.2 wt % to 4 wt %:4 wt %) and the applied pressure (from 0.1 psi to 20 psi), and the solvent evaporation time is changed from tens of minutes to a few seconds depending on the applied pressure. No significant differences are observed as to the performances of the ESSENCIAL-based devices that have the same thickness, but are fabricated by different conditions such as the concentration of solution, applied pressure, or processing time. Every fabricated device has an approximate thickness of about 240 nm of active layer, which is measured by Dektek profiler. To confirm the effect of PEDOT:PSS layer to the device performances, $O_2$ plasma treated ITO substrates are also used to substitute the PEDOT:PSS/ITO substrate.

Hole-only devices have the following structure: transparent substrate/ITO/PEDOT:PSS/P3HT:PCBM/$MoO_3$/Al. After following the processes mentioned above, 20 nm of $MoO_3$ is deposited onto the active layer instead of LiF and Al deposition through the shadow mask to complete device fabrication. Electron-only devices have a structure as follows: transparent substrate/ITO/$Cs_2CO_3$/P3HT:PCBM/LiF/Al. 0.2 wt % $Cs_2CO_3$, dissolved in 2-ethoxyethanol, which is spin-cast on ITO substrate and subsequently baked at 170° C. for 20 min. The remaining procedures, such as active layer deposition and cathode deposition, are chosen according to different types of processing.

Device Performances Measurements

Current versus voltage characteristics are measured with HP4156B semiconductor analyzer by illuminating the polymer PV cells with AM 1.5 G simulated sun light using Oriel Solar Simulator at the irradiation intensity of 100 mW $cm^{-2}$, which is calibrated by power meter (OPHIR, Nova-Oriel) and a reference silicon solar cell. Incident photon to collected charge carrier efficiency (IPCE) spectra for EQE are measured with a 150 W Oriel Solar Simulator light source, an Acton Research Corp. Spectra-Pro 275 monochromator, a chopper wheel, and a Stanford Research 830 Lock-In Amplifier. The photocurrents are measured and normalized against a Hammamatsu Si photodiode reference, and long pass filters are used to block transmission of any stray second or third diffractions outside of the range of interest.

Morphology Characterizations

The absorption spectra of polymer blends are measured using a Varian Cary 50 UV/Vis spectrophotometer. Photoluminescence spectra are obtained using PTI Quantamaster spectrofluorometer equipped with an integrating sphere. A Digital Instruments NanoScope IIIa-Phase Atomic Force Microscope is used to obtain the AFM images.

Roll-To-Roll Process for Polymer PV Cells

The modified PDMS silicone sheet film is rolled around a nitrile rubber-coated nylon fabric belt that is wrapped around two polytetrafluoroethylene (PTFE) rollers. Liquid phase organic precursor (blend solution) is continuously coated on the ITO substrate between the upper and lower rollers and the solvent is evaporated through the gas-permeable silicone film while the roller pressure is applied. Web speed (10-20 mm $s^{-1}$) is controlled by an AC motor controller. Rolling force is measured in real-time by a flexible force sensor (Tekscan, Inc.) and adjusted by a clamping device. The squeezed flow behavior of the solution in the roll-to-roll process follows the dynamic elastic contact model and the thickness of liquid coating is controlled by the solution concentration, the roller pressure and the rolling speed. The blend-film coated ITO substrate separates from the silicone film continuously as the web moves forward. After 1 minute of heating at 130° C., thermal deposition of Li and Al as electrodes over the surface of the active polymer semiconductor material completes the device.

Morphology-Optimized Scalable Bulk Heterojunction Polymer Solar Cells

In certain embodiments, polymer solar cells fabricated according to the present teachings have the following planar configuration: an anode/a buffer layer/a photovoltaic active material layer comprising an electron donor and an electron acceptor/a cathode. In certain variations, the buffer layer is optional. In one embodiment, the anode comprises a transparent substrate/ITO, the buffer layer comprises PEDOT:PSS (~45 nm), the photovoltaic active material comprises P3HT: PCBM (~240 nm) and finally the cathode comprises LiF (~1 nm)/Al (~80 nm, island-type circular shape with 3.5 mm diameter). For example, in one variation, the ESSENCIAL process for fabricating polymer solar cells, includes first (a) applying a liquid precursor polymer blend solution; then (b) forming the active layer during solvent evaporation through a gas-permeable silicone cover layer under pressure; and then (c) depositing isolated island-type cathodes on top of the polymer blend film after removing the PDMS stamp.

Device Performances of Organic Solar Cells

The device performances including PCE and J-V curves are measured under AM 1.5G simulated sun light (at 100 mWcm$^{-2}$ intensity). In device fabrication, an isolated island-type metallic cathode is used to exclude the overestimation of the photocurrent commonly occurred in devices using crossbar type electrodes. The patterned crossbar-type electrode geometry is the most commonly used configuration for organic light emitting diodes (OLEDs) because this structure allows easy addressing of individual pixels. The same crossbar-type electrode geometry has been adapted to OSC fabrication for the same convenience. However, while acceptable for OLEDs, the crossbar-type electrode geometry can lead to an incorrect analysis of PCE of the organic solar cells (OSCs). The solar cells having the island-type electrode geometry gave a consistent cell performance, but the performance of the crossbar-type cells varied greatly depending on the size of the illuminated light beam on the cells relative to the overlapped area of the crossbar electrodes. When the illuminated area is larger than the overlapped area of the crossbar electrodes, even though there is no ITO electrode outside the overlapped region, the conductive PEDOT:PSS layer plays the role of an effective anode. In other words, the crossbar-type cells can be regarded as composing of two OSCs connected in parallel: one is the solar cell having ITO anode and cathode in the overlapped region, and a parasitic one having PEDOT:PSS as an effective anode instead of ITO. For example, a PEDOT: PSS/P3HT:PCBM/LiF/Al OSC was formed on a glass substrate without ITO to mimic the parasitic OSCs. Indeed, the devices show photovoltaic characteristic, but with a fill factor (FF) of only 0.25, which is much smaller than the FF of 0.61 of the equivalent device having ITO. This is also believed to explain why the decrease of FF of the crossbar-type OSCs is accompanied by the increase of Jsc when the illuminated beam size increased, which appears to be due to the contribution of the parasitic OSC to the total measured Jsc. As noted above, PCE can be overestimated as much as by 30%, and this can be even higher depending on electrode design and measurement conditions.

Using the isolated island-type Al cathode, the performances of the devices depending on the processing methods are summarized in Table 2. The values reported in this table are averaged using the data obtained by at least 20 cells.

TABLE 2

Performances of devices fabricated by different processing methods.

| Method | $V_{OC}$ (V) | $J_{SC}$ (mAcm$^{-2}$) | FF | PCE | $R_S$ (Ωcm$^2$) |
|---|---|---|---|---|---|
| Spin-casting | 0.65 | 6.83 | 0.62 | 2.62 | 14.5 |
| Thermal Annealing (TA) | 0.61 | 8.34 | 0.65 | 3.30 | 3.3 |
| Solvent-Assisted Annealing (SAA) | 0.58 | 10.37 | 0.67 | 3.95 | 2.0 |
| INVENTIVE ESSENCIAL[a] | 0.60 | 11.48 | 0.69 | 4.56 | 1.2 |
| INVENTIVE ROLL-TO-ROLL[b] | 0.60 | 11.30 | 0.67 | 4.49 | 1.4 |

[a]ESSENCIAL sample was further treated by heat for 1 minute
[b]The solar cells fabricated by roll-to-roll processing are prepared without a PEDOT:PSS buffer layer.

The devices fabricated by the inventive ESSENCIAL method followed by the thermal treatment showed the highest PCE due to the optimized domain morphologies and charge pathways that resulted in both increased short circuit current and fill factor. The favorable morphology also led to the lowest series resistance (Rs~1.2 Ωcm$^2$) as expected. The devices fabricated by roll-to-roll process, the scalable version of the ESSENCIAL process, also show the comparable PCE (~4.56%). This new ESSENCIAL formation process can be equally applicable to BHJ structures using other materials (e.g., the low band gap polymer semiconductors that demonstrated higher PCE), making it widely applicable manufacturing technique for mass production of low cost and high efficiency polymer solar cells.

An ideal structure to achieve high efficiency organic photovoltaic (OPV) cells includes interdigitated networks of electron-donor and acceptor, which are vertically oriented to the cathode and the anode within the exciton diffusion length, which has been measured to be less than about 20 nm. By forming such controlled nanoscale morphology between the donor and the acceptor, the excitons can be fully dissociated to electrons and holes, and can be efficiently transported to the electrodes before recombination, thereby maximizing power conversion efficiency (PCE). FIG. 4 depicts the ESSENCIAL processes to realize these types of heterojunction structures.

The method includes an ESSENCIAL process that employs two distinct processing steps. The first ESSENCIAL process can be performed to form a nanoscale pattern, such as a pattern of high aspect ratio nanopillar structures, in electron-donor material using a gas-permeable stamp comprising nanohole or void type of pattern, and the second ESSENCIAL process can be used to uniformly cast acceptor material(s) on the nanostructured donor layer. In processing, an orthogonal carrier or solvent between the donor and acceptor materials can be used. For example, one carrier can be aqueous and the other carrier can be nonaqueous. Such an orthogonal carrier can favorably further facilitate the desired orientation and morphology of the organic donor and acceptor materials in the solidified active layers. Finally, a metal electrode, for example comprising aluminum and lithium fluoride (LiF), can complete the process.

In yet other preferred aspects, the active material can include forming a photovoltaic material by two-step evaporation/volatilization of solvent through surface encapsulation and induced alignment. Thus, in such a method shown in FIGS. 4(a)-(e), a first electrode, such as a transparent electrode (anode) assembly 302 is provided that includes a transparent substrate and a transparent ITO layer. A buffer layer 310 of PEDOT:PSS is provided over the anode assembly 302. A first liquid precursor 312 includes a first carrier and one of an organic electron donor material and an organic electron acceptor material. In FIG. 4(a), the first liquid precursor comprises an electron donor material, like P3HT. In variations like that shown in FIG. 4(a), the first liquid precursor 312 is disposed onto a buffer layer (e.g., comprising PEDOT and PSS) 310 adjacent to the electrode 302. As noted above, in certain alternative embodiments, the first liquid precursor 312 is disposed onto the anode assembly 302 directly. A first gas permeable surface in the form of a first stamp 320 is placed into contact with the first liquid precursor 312.

The gas permeable stamp 320 defines a nanoscale pattern 322 along its contact surface, which may include projections and/or voids. Pressure is applied to the first liquid precursor 312 disposed between the nano scale pattern 322 of the gas permeable stamp 320 and the first electrode 302, so that at least a portion of the first carrier is removed by the first gas permeable stamp 320 to form a first solid active material 330. In FIG. 4(b), the first gas permeable stamp 320 is then removed from the first solid material 330 leaving an impression of the nanoscale pattern to form a first patterned surface 322 along an exposed surface of the first solid material 330. The nanoscale pattern 322 defines a plurality of void regions that when filled with the first liquid precursor 312, which are then solidified, form a plurality of nano-pillar structures 334. Such nano-pillar structures enable the formation of interpenetrating network domains of the electron donor material and the electron acceptor material, as will be discussed in greater detail below. In certain preferred aspects, the nano-pillar may have a height of less than or equal to about 50 nm, optionally less than or equal to about 25 nm, and in certain aspects, less greater than or equal to about 10 nm and less than or equal to about 15 nm. While a pillar shape is shown as being preferred, in other variations, other shapes and sizes of the nano-features are contemplated depending upon the application and desired interpenetrating network design. Next, a second gas permeable stamp 340 is used for a second evaporation step. The second stamp 340 defines a flat contact surface 342. A second liquid precursor 350 comprises a second carrier and the other of the organic electron donor material or the organic electron acceptor material (in other words, the material that was not included in the first liquid precursor). Here, the second liquid precursor 350 comprises the electron acceptor material, such as PCBM. It is applied to the first patterned surface 332 in FIG. 4(c). Pressure is applied to the second liquid precursor 350 disposed between the flat contact surface 342 of the gas permeable stamp 340 and the first patterned surface 332, so that at least a portion of the second carrier is removed by the second gas permeable stamp 340 to form a second solid active material 360. In FIG. 4(d), the second gas permeable stamp 340 has been removed from the second solid material 360. In accordance with the present teachings, the second liquid precursor 350 is disposed onto the first patterned surface 332, which when solidified establishes comprehensive and intimate contact with the first solid material, including in the valleys and grooves of the nano-pattern. Establishing such comprehensive mating of the first solid material to the second material assists with establishing the desirable bulk heterojunction in the photovoltaic active material, therefore improving photovoltaic cell performance. As shown in FIG. 4(d), interpenetrating network domain regions 362 are desirably formed where nano-structures of the first and second solid materials are interspersed with one another at regular intervals. As noted above, the inventive technology enables substantially uniform interpenetrating network domains of the electron donor and acceptor materials in a direction normal to the electrode (e.g., in the vertical direction in FIGS. 4(a)-(e)). The first solid material 330 and the second solid material 360 together define the solid photovoltaic active layer. Finally, a second electrode material 366 can be disposed over the second solid material 360 to form the photovoltaic cell.

In other methods of the present disclosure, such as that shown in FIGS. 5(a)-(e), a similar method of making the photovoltaic cell is used to that described just above, however, the second stamp that applies pressure to the second liquid precursor defines a patterned contact surface rather than a flat contact surface. Common reference numerals and steps will not be repeated herein, including the steps shown in FIGS. 5(a)-(b), which are the same as the methods described in the context of FIGS. 4(a)-(b). After the second liquid precursor 350 is applied to the first patterned surface 332, a second gas permeable stamp 370 comprising modified polydimethylsiloxane (PMDS) is used to apply pressure thereto. The second stamp 370 defines a second pattern 372. For example, the second pattern 372 can be in the form of different surface topographies (e.g., in the form of periodic grids). Such topographies, when imprinted into the second material (e.g., electron acceptors) during the second evaporation step and over-coated with metal electrode, can produce a light trapping effect desirable for thin film solar cells to improve light absorption by the organic semiconductors.

Next, pressure is applied to the second liquid precursor 350 via the second gas permeable stamp 370 along the surface having the second pattern 372, so that the second liquid precursor 350 conforms to the first patterned surface 332 of the first solid material 330. At least a portion of the second carrier is removed from the second liquid precursor 350 through the second gas permeable stamp 370 to form a second solid material 376. Then, the second stamp 370 is removed from the second solid material 376 to leave a second patterned surface 380 on the second solid material 376.

As shown in FIG. 5(d), a plurality of rectangular protrusions or raised gating type structures 382 are formed along the second patterned surface 380. The second patterned surface 380 can be and is preferably distinct from the first patterned surface 332. For example, the first patterned surface 332 may define features on a nano-scale where the greatest dimension is less than or equal to about 1 micrometer, optionally less than or equal to about 500 nanometers, optionally less than or equal to about 100 nanometers, optionally less than or equal to about 50 nanometers, and in certain preferred aspects, less than or equal to about 20 nanometers. In certain embodiments, the first nanoscale patterned surface 332 defines a plurality of nano-pillars 334 that are less than or equal to about 15 nanometers but greater than or equal to 10 nanometers in height.

In certain aspects, the second patterned surface 380 has a surface topology that creates a light trapping feature, for example, in the form of periodic grids or rectangles having dimensions of a scale corresponding to the wavelengths of light. Thus, the dimensions of the grating may be preselected based upon a wavelength of light entering the photovoltaic cell to enable light trapping. For visible and infrared electromagnetic radiation, for example visible light has wavelengths ranging from about 390 to about 750 nm and infrared radiation (IR) (including near infrared (NIR) ranging from about 0.75 to about 1.4 pm; short wave infrared (SWIR) ranging from about 1.4 to about 3 pm; mid wave infrared (MWIR) ranging from about 3 to about 8 pm; long wave infrared (LWIR) ranging from about 8 to about 15 pm; and far infrared (FIR) ranging from about 15 µm to 1 mm)). Such a second patterned surface 380 in the second material 376 serves to maximize absorption of light into the active material of the photovoltaic cell. Such dimensions of the light trapping feature formed on the second active material, for example in the form of a rectangular protrusions, can optionally include the greatest dimension being less than or equal to about 1 millimeter, optionally less than or equal to about 100 micrometers, optionally less or equal to than about 10 micrometers, optionally less than or equal to about 2 micrometers, optionally less than about or equal to 1 micrometer, optionally less than or equal to about 750 micrometers, but greater than or equal to about 300 micrometers.

Finally, a second electrode 390 is applied to at least a portion of the second patterned surface 380. The second electrode material 390 forms fills in any voids and mates with the second solid material 376 to form a complementary shape against the second patterned surface 380. Thus, the second electrode 390 and the second patterned surface 380 together have a surface topography that creates a light trapping feature 392 that performs the function of light trapping for light that enters/is scattered within the photovoltaic active material. Much like in the embodiment of FIGS. 4(a)-(e), the first solid material 330 and the second solid material 376 together form a photovoltaic material comprising interpenetrating network domains of the organic electron donor material and the organic electron acceptor material in a direction normal to a major surface of the first electrode, for example, a vertical direction.

Compared with conventional nanoimprint lithography, which needs high temperature (>100° C.) and high pressure (>hundreds of psi) to achieve tens of nanometer size patterns, the method employing two ESSENCIAL processes requires only negligible pressure (e.g., a few psi) and does not require heat to form high aspect ratio nanopatterns. Furthermore, the second ESSENCIAL process as shown at FIG. 4(c) can provide a more uniform and ideal heterojunction between the donor and acceptor, which cannot be achieved by conventional spin-casting process that usually induce voids in the nanometer scale trench.

FIG. 6 shows the gas-permeable PDMS stamp having about 20 nm holes. The resultant (about 15 nm) aspect ratio nanopillars composed of high performance electron-donor materials, such as poly(3-hexylthiophene) (P3HT) and poly [N-9"-hepta-decanyl-2,7-carbazole-alt-5,5-(4',7'-di-2-thienyl-2',1',3'-benzothiadiazole) (PCDTBT), are shown in FIGS. 7(a) and (b), respectively.

The current density versus voltage characteristics of photovoltaic devices having active layer composed of P3HT and PCBM are shown in FIG. 8. Compared with conventional OPV devices having bulkheterojunction (BHJ) structures, the photocurrent of nanostructured device is increased by more than 50%, from 8.63 mAcm$^{-2}$ to 13.02 mAcm$^{-2}$ at AM 1.5 G measurement condition with an intensity of 100 mW cm$^{-2}$, and the resultant power conversion efficiency of OPV devices are improved from 3.35% to 4.41%.

Moreover, this two-step ESSENCIAL process for nanostructured OPV cells also can be readily expandable to large area high-speed roll-to-roll processes, as shown in FIG. 9, which is similar to the BHJ OPV cell case as described. The gas-permeable stamp having about 20 nm nanoholes can be used in the two-step ESSENCIAL process instead of the flat PDMS stamp.

In certain aspects, an organic photovoltaic, such as a solar cell, can be made in accordance with the ESSENCIAL process by first forming transparent electrodes having metallic nanostructure. Such transparent conductive electrodes (TCEs) having metallic nanostructures can desirably replace conventional ITO electrodes, due to superior properties including high optical transparency, good electrical conductivity and mechanical flexibility, and the versatility that these properties can be adjusted independently by changing the line width and thickness of the metal grid structure of the electrode during formation. Furthermore, such metallic nanostructure TCEs have unique optical properties due to the excitation of surface plasmon resonance (SPR) by the metallic nano-gratings to enhance the light absorption of organic semiconductors that results in enhanced PCEs over comparative ITO electrode devices. In addition, the present technology includes combining the formation of such metallic nanostructure TCEs with the various ESSENCIAL processes as described.

A transparent metal electrode (TME) in the form of a periodic nanoscale metal wire grid fabricated by nanoimprint lithography (NIL) having high optical transparency and good electrical conductivity can form a suitable TCE in certain variations. Such properties can be adjusted independently by changing the metal line widths and thicknesses in the metal grid structure. In addition, such a TME can be fabricated by a roll-to-roll process for low cost and scalable manufacturing. Not only do metal electrodes provide excellent optical transmittance and electrical conductivity, but also the nanoscale metallic nanowire structures can exhibit unique optical properties due to the excitation of surface plasmon resonance (SPR), which can be exploited in specially designed solar cells. For example, the present TMEs can provide about a 35% PCE enhancement as compared to devices made with a conventional ITO electrode. The device examples described herein are characterized under ambient conditions without encapsulation.

Transparent Metal Electrode for Organic Solar Cell Application

A transparent metal electrode, in the form of nanoscale periodically perforated dense metal mesh film on a glass or plastic substrate, is provided as shown in FIG. 10. The high transparency metal electrode can be fabricated by nanoimprint lithography (NIL) and have several advantages over other highly transparent electrodes such as those including ITO. First, the work function of nanopatterned transparent metal electrode can be easily tuned by choosing different metal materials, which allows systematic studies of the effect of the electrode work function on the device performance. Second, a high electrical conductivity can be achieved without seriously compromising the transparent. Third, the light absorption and the resulting PCE of OSC can be increased by means of a light trapping or intensifying phenomenon induced by the grating structure. And fourth, large area OSC having a transparent metal electrode can be formed at a low cost by using a newly developed roll-to-roll nanoimprint technique.

Design of Transparent Metal Electrodes

Transparent metal electrodes can be fabricated based on two design considerations: 1) the line-width of the metal mesh is designed to be sub-wavelength to provide sufficient transparency and to minimize light scattering and reflection; 2) the period of the mesh "a" in FIG. 10 is chosen to be submicron to ensure the uniformity of the current collection from the organic semiconductors. This mesh serves as the main part of the transparent metal electrode. An orthogonal mesh with a period of "b" is used to ensure the electrical connectivity of the main grating lines in case some of lines become disconnected due to one or more defects in the fabrication process. The optimum period of metal grating can be determined by considering the sheet resistance of poly(3,4-ethylenedioxythiophene):poly(styrenesulfonate) (PEDOT:PSS), which in turn determines the voltage drop between the adjacent metal lines as the photocurrents are collected. The total voltage drop in the device area, assumed to be 0.1 cm$^2$, can then be estimated by considering the number of metal lines in the whole device area at certain period of grating. If total voltage drop is assumed to be about 10 mV, then the optimum period can be determined.

As described by M.-G. Kang, M.-S. Kim, J. Kim, and L. J. Guo, "Organic solar cells using nanoimprinted transparent metal electrodes," Adv. Mater., vol. 20, pp. 4408-4413, 2008, an optimum period of the transparent metal electrode nanopatterned metal grating can be calculated as a function of sheet resistance of the PEDOT:PSS layer. Choosing the metal grating period and the PEDOT sheet resistance within certain regions can lead to negligible loss of photocurrent and improved OSC performance.

Fabrication of Transparent Metal Electrode on a Glass Substrate

In certain variations, large area transparent metal electrodes are fabricated by NIL, which due to its inherent high resolution and high throughput features is well suited for such methods of formation. The details of the fabrication of the mold for NIL and transparent metal electrodes are described in the documents: M.-G. Kang, M.-S. Kim, J. Kim, and L. J. Guo, "Organic solar cells using nanoimprinted transparent metal electrodes," Adv. Mater., vol. 20, pp. 4408-4413, 2008; M.-G. Kang and L. J. Guo, "Nanoimprinted semitransparent metal electrodes and their application in organic light emitting diodes," Adv. Mater., vol. 19, pp. 1391-1396, 2007; and U.S. patent application Ser. No. 12/100,363, filed on Apr. 9, 2008, titled "Roll to Roll Nanoimprint Lithography" to Guo et al. (published as U.S. Pat. Pub. No. 2009/0046362), which are incorporated herein by reference. For example, a fabricated mold with a period of 700 nm and line-width of 70 nm for the main grating can be employed. A secondary grating with a period of 10 μm and a line-width of 400 nm can be used to ensure the electrical connectivity of the main grating while minimizing transmittance loss. Such NIL techniques can successfully create large area transparent metal electrodes. Nanoscale patterning of the metal film provides a high transparency conductive electrode whose transmittance is comparable to commercially available standard ITO electrodes.

High transparency metal electrodes using Au, Cu and Ag can be used, but any other metals can be used for this purpose as well. Sheet resistance of a metal electrode can be decreased to less than a few ohms per square with only a small decrease of the average transmittance. This characteristic is another advantage over an ITO electrode, in which the sheet resistance has to be compromised in order to achieve high transmittance. Low sheet resistance (i.e., high electrical conductivity) of the transparent electrode is an important aspect of an OSCs, especially in large area devices because the resistance of the transparent electrode in large area OSC causes additional reduction of the device fill factor (FF), resulting in reduced PCE. Therefore, transparent metal electrodes created in accordance with these techniques can avoid the disadvantages of the ITO electrode and also meet the requirements of both high optical transmittance and high electrical conductivity, for large area OSC applications.

Fabrication of Transparent Metal Electrode on Plastic Substrate

Transparent metal electrodes can be used as replacements for ITO electrodes. However, in certain aspects, the lithographic technique used (e.g., NIL) for the fabrication of the transparent metal electrode may not be compatible with a flexible substrate. Conventional NIL methods require high pressures and high temperatures when imprinting thermoplastic materials, which can cause deformation of flexible substrates. Therefore, other nanoscale patterning techniques which can easily produce the nanostructure metal mesh pattern are needed. Accordingly, nanolithography based on metal transfer printing using a flexible poly(dimethysiloxane) (PDMS) stamp can be used to produce nanoscale metal patterns directly on a plastic substrates (e.g. polyethylene terephthalate, PET) or polymer (e.g. PEDOT:PSS) coated PET substrates; see M.-G. Kang, M.-S. Kim, J. Kim, and L. J. Guo, "Organic solar cells using nanoimprinted transparent metal electrodes," Adv. Mater., vol. 20, pp. 4408-4413, 2008 and U.S. patent application Ser. No. 12/100,363, filed on Apr. 9, 2008, titled "Roll to Roll Nanoimprint Lithography" to Guo et al. (published as U.S. Pat. Pub. No. 2009/0046362).

FIG. 11 shows the optical transmittance spectra, photograph, and SEM image of a high transparency Cu mesh electrode fabricated by metal transfer printing on a PEDOT:PSS coated PET substrate. Though other metals such as Au and Ag can be used in place of Cu, here the result of a Cu mesh electrode is shown due to its lower cost. Cu, being one of the cheaper metals, is well suited for practical low-cost and large area OSC applications.

A fabricated Cu electrode is much more flexible than an ITO electrode, as demonstrated by simple bending tests and the data shown in FIG. 12. In the case of the transparent Cu electrode, it can be bent to about 3 mm radius of curvature with no degradation of the conductance. On the other hand, the ITO exhibited a reduction of the conductance even at a radius of about 30 mm, which can reach close to zero due to the micro-cracking in the ITO film after the bending on the order of about 20 μm.

The fabrication of the nanopatterned metal electrode using the metal transfer printing technique can be extended to cost effective and large area fabrication such as roll-to-roll nanoimprint lithography (R2RNIL) with the use of flexible molds; see S. H. Ahn and L. J. Guo, "High-speed roll-to-roll nanoimprint lithography on flexible plastic substrates," Adv. Mater., vol. 20, pp. 2044-2049, 2008 and S. H. Ahn and L. J. Guo, "Large-Area Roll-to-Roll and Roll-to-Plate Nanoimprint Lithography: A step toward High-Throughput Application of Continuous Nanoimprinting," ACS Nano, vol. 3, no. 8, pp. 2304-2310, 2009, which are incorporate herein by reference. A nanoscale metal (e.g., Au) grating on a large area PET substrate can be created using a roll-to-roll process, as shown in FIG. 13. Other metals, such as Ag and Cu, can also be fabricated using such a continuous process.

Organic Solar Cells Using Transparent Metal Electrode

A nanopatterned high transparency metal conducting electrode for OSCs can be formed as described and can be combined with bulk heterojunction devices based on a blend of poly(3-hexylthiophene) (P3HT) and [6,6]-phenyl C61 butyric acid methyl ester (PCBM) as active material. Such electrodes and active material devices can be compared to devices made with a commercial ITO electrode on a glass substrate. The fabricated solar cells have an area of approximately 0.1 cm$^2$ (circular shape shadow mask with 3.5 mm diameter). The patterned Al cathode has isolated island type geometry to exclude the overestimation of the photocurrent when a cross-bar type geometry is used. The current density (J) versus voltage (V) characteristics at 1 sun (AM 1.5G) can be measured, as described by M.-G. Kang, M.-S. Kim, J. Kim, and L. J. Guo, "Organic solar cells using nanoimprinted transparent metal electrodes," Adv. Mater., vol. 20, pp. 4408-4413, 2008. The results are averaged using the data obtained by at least twenty cells for each electrode. The J-V characteristics of the solar cells having the nanopatterned transparent metal electrodes and ITO electrode are very similar to each other, indicating that such electrodes are interchangeable. All devices show a PCE of about 2%. The PCE is lower in these examples than those reported in literature because all of the present devices are fabricated and tested in the ambient environment with no special control for the effects of oxygen and moisture. PEDOT:PSS and the blend material are spin-coated and baked in a $N_2$ glove box. The device fabricated with the metal electrode on flexible PET substrate also performed similarly to the conventional ITO device. These results indicate that the transparent metal electrode can potentially replace the ITO electrode with better flexibility and lower cost.

In certain aspects, the present technology includes an organic photovoltaic, such as a solar cell, having a surface plasmon enhanced efficiency using a transparent silver nanowire electrode. To enhance the power conversion efficiency (PCE) of a device, both the light absorption in the organic layer and the electrical transport of the photo-generated carriers can be enhanced. High absorption of the incident light can be achieved by using a thick organic active layer. However, a thick active layer increases the series resistance and recombination loss due to the low carrier mobility of the organic materials, resulting in a reduced FF and thus reduced efficiency. Therefore, an effective approach to enhance the efficiency of a thin film OSC is to increase the light absorption of the organic film without having to increase the photoactive layer thickness.

For this purpose, several light trapping approaches including a folded configuration, diffraction grating, photonic crystal, and surface plasmon resonance (SPR) are investigated. Among these approaches, the utilization of the SPR in metallic nanostructures is one of the most promising ways, as surface plasmons exhibit strongly enhanced electromagnetic fields in the vicinity of metal by the incident light, which can lead to increased optical absorption in the organic film and therefore higher efficiency. Ag nanoparticles have been widely used to increase optical absorption by the SPR effect. However, the field enhancement from metallic nanoclusters is highly localized around the nanoclusters and the possible exciton quenching can limit the utility of such nanoclusters in thin film OSCs. Moreover, most of the works using Ag nanoparticles have been done on conventional device structures in which ITO is used as a transparent electrode. It would be beneficial if the transparent electrode itself can excite the SPR and thus increase the optical absorption of the organic layer of the device. We have demonstrated the enhancement of PCE of an organic thin film solar cell using periodic Ag nanowire electrodes as compared to that of a conventional device using ITO electrode through the SPR in Ag nanowire electrodes.

In yet other preferred aspects, the active material can include forming a photovoltaic material by two-step evaporation of solvent through surface encapsulation and induced alignment, where the photovoltaic material is designed to include a light trapping feature. Such an embodiment was described above in the context of FIGS. 5(a)-(e), where a second stamp is used on a second liquid precursor. The second stamp has surface topographies (e.g., in the form of periodic grids) that are imprinted into the second material (e.g., electron acceptors) during the second evaporation step and can then be over-coated with metal electrode to produce the light trapping effect desirable for thin film solar cells to improve light absorption by the organic semiconductors. Thus, the second patterned surface may have a surface topology that can create an impression in the second material that creates a light trapping feature, for example, in the form of periodic grids or rectangles having dimensions of a scale corresponding to the wavelengths of light entering the photovoltaic cell. Thus, the dimensions of the grating may be preselected based upon a wavelength of light entering the photovoltaic cell to enable light trapping.

Fabrication of Ag Nanowire Electrodes

The period and thickness of Ag nanowire electrodes investigated in this work are 220 nm and 40 nm, respectively. Two sets of Ag nanowire electrodes with different line-width (95 nm and 55 nm) are prepared based on initial simulation results that showed different field enhancement factors for the Ag nano-gratings with different duty cycles. Ag nanowires with wide (95 nm) and narrow line-width (55 nm) are referred to as AgW and AgN respectively hereafter. Ag nanowire electrodes can be fabricated using NIL and shadow evaporation techniques. FIG. 14 shows the optical transmittance of the fabricated Ag nanowire electrode together with that of conventional ITO electrode and a SEM image of AgN nanowire electrode.

As shown in FIG. 14(b), uniform, transparent Ag nanowire electrodes are successfully fabricated by NIL. The average transmittance values, referenced to air in the visible range, of Ag nanowires with a line-width of 95 nm, 55 nm, and ITO electrode are 58%, 77%, and 87%, respectively. Periodically patterned Ag films exhibited light absorption at specific wavelength ranges by SPR as shown in optical transmittance spectra. The resonance wavelength is around 425 nm and is expected to red shift to the absorption band of the organic semiconductor when it is coated over the Ag nanowires due to an increased refractive index.

Organic Solar Cells Using Transparent Ag Nanowire Electrodes

In certain variations, a small molecular weight organic solar cell (SMOSC) can be fabricated using copper phthalocyanine (CuPc) and buckminsterfullerene ($C_{60}$) as an electron donor and acceptor, respectively. The fabricated devices have the layered structure of anode (Ag nanowire or ITO), PEDOT:PSS, CuPc, C60, bathocuproine (BCP), and cathode (thick Ag film) from bottom to top. The cathode can be formed by depositing Ag through a circular shape shadow mask with a diameter of 1 mm. FIG. 15 shows (a) a schematic of the fabricated device and (b) cross-sectional SEM image of a device fabricated using the Ag nanowires but without the thick Ag cathode.

As shown in FIG. 15, there is a difference in cross-section view between The schematic and the real sample due to the thickness (about 40 nm) of Ag nanowire electrodes and nature of thermal evaporation of small molecules. Fabricated samples have a sinusoidal shape with a maximum height difference of about 30 nm. The effects of nonplanar shape of the device are discussed later. Conductive PEDOT:PSS is optional (as discussed herein), but when used is generally done for the following purposes: (1) it can facilitate the transport of the photo-generated holes to the Ag nanowire electrodes, (2) it can prevent the direct contact of the organic active layer to the Ag nanowire which reduces the chance of the device shunt, and (3) it can also block potential exciton quenching by the metal.

Several devices with different thicknesses of the organic layers are fabricated to investigate the dependence of the optical field enhancement by the SPR on the organic layer thicknesses in a given Ag nanowire geometry. For all cases, the thickness of the PEDOT:PSS and BCP is fixed at about 30 nm and about 8 nm, respectively. The total organic layer thickness is controlled by changing the thickness of CuPc and C60 while attempting to keep the ratio of two materials the same. Table 3 summarizes the thicknesses of the organic layers of the fabricated devices. For all considered cases, devices are fabricated using commercial ITO or using AgW and AgN electrodes. More than twenty devices for each case are fabricated and measured.

TABLE 3

Thickness of the organic layers of the fabricated devices.

| Device # | Thickness (nm) | | | | |
|---|---|---|---|---|---|
| | PEDOT | CuPc | $C_{60}$ | BCP | Total |
| 1 | 30 | 28 | 44 | 8 | 110 |
| 2 | 30 | 25 | 35 | 8 | 100 |
| 3 | 30 | 20 | 32 | 8 | 90 |
| 4 | 30 | 16 | 26 | 8 | 80 |
| 5 | 30 | 12 | 20 | 8 | 70 |

Measurements show that the device parameters such as Voc and FF are similar for both the ITO and Ag devices at each organic layer thickness (Table 3) except device #5, which showed much reduced Voc, ~0.37 V that can be attributed to the shunt path between the edge of the Ag nanowires and the top cathode due to the very thin organic layer (70 nm). Device #1 and #2 having relatively thicker organic layer showed smaller FF (0.4) for both ITO and Ag devices as compared with that (0.5) for the device #3 and #4 with thinner layers. This is because thicker organic layer presents higher resistance to the photocurrent due to low carrier mobilities of organic materials. Similar Voc and FF for both ITO and Ag devices indicate that the patterned Ag electrode did not affect the device fabrication using thermal evaporation of small molecule materials and the collection of the photo-generated carriers. While having similar Voc and FF for all devices, the short-circuit current (Jsc) showed a dramatic difference. Overall, the Jsc of the ITO device decreases with reducing organic layer thickness because of the lower absorption in thinner devices. In sharp contrast, the AgN device showed enhanced Jsc as the organic layer thickness decreases, as shown in FIG. 16(a).

For thick organic layers (devices #1 and #2), the Jsc of the device made with AgN is comparable to that of the ITO device. For organic layers thinner than 100 nm (devices #3, #4, and #5), the Jsc of the device with AgN is enhanced as much as 43% compared to that of ITO device as the thickness of the total organic layer decreases to 70 nm. This is consistent with our simulation results that showed stronger SP enhancement effect for thinner organic layers. The device made with AgW also showed a similar behavior to AgN device but the overall enhancement is lower due to the low transmittance of the AgW electrode, as shown in FIG. 14(a). FIG. 16(a) shows the dependency of the Jsc and PCE of each device (ITO, AgN, AgW device) on the thickness of the organic layer. FIG. 16(b) shows the J-V curve of the device #4 which exhibits the highest enhancement of the Jsc and the overall PCE. In fact, the device #5 showed the highest enhancement of the Jsc but the PCE is low due to the low Voc.

Each device has a different thickness of the organic layer resulting in different absorption efficiency. As such, the enhancement factor of the Jsc of the Ag devices is extracted by normalizing the Jsc of the Ag devices with that of the ITO device and shown in FIG. 17. The dotted lines show the expected Jsc purely based on the transmittance of each electrode when there is no absorption enhancement. SPR is believed to enhance the light field and this leads to the enhanced absorption efficiency accordingly resulting in the increased Jsc. The difference between actual enhancement (solid line) and expected enhancement (dotted line) can be regarded as a net enhancement factor when the transmittance of each electrode is considered. The actual enhancement in the AgW device is much lower than that of the AgN device. This result indicates that transmittance of the anode is an important factor for the device to achieve high PCE. As a result of the increased Jsc, absolute PCE enhancement is achieved for the device with AgN electrode due to the increased Jsc as compared to the device with ITO electrode. For device #3 with organic layer thickness of 90 nm, the PCE of the ITO and AgN device is 1.2% and 1.41%, respectively, which leads to about 18% enhancement of the PCE. For device #4 with organic layer thickness of 80 nm, the enhancement achieved is even higher. About 35% PCE enhancement is achieved with the PCE of 0.96% and 1.32% for the ITO and AgN device, respectively.

To further demonstrate that increased Jsc is due to the enhanced absorption due to the excitation of SP, incident photon to current efficiency (IPCE) is measured for each device. The obtained external quantum efficiency (EQE) spectra for device #4 are shown in FIG. 18(a). The AgN device showed EQE enhancement for wide visible range. Since the EQE is approximately proportional to the absorption efficiency, the increase in Jsc can be attributed to the enhanced absorption by the organic semiconductors in the Ag nanowire electrode. The enhancement factor of the absorption efficiency of the Ag device relative to the ITO device as a function of wavelength can be extracted from the ratio of the EQE between the Ag devices and the ITO device. As shown in FIG. 18(b), AgN device showed more EQE enhancement than ITO device over a wavelength range 450 nm-700 nm. About a 2.5 fold EQE enhancement is achieved at around 570 nm for the AgN device #4.

Simulations based on rigorous coupled wave analysis (RCWA) are performed to map the internal optical field of the device structure shown in FIG. 15(a). Measured complex refractive index data for each organic layer are used. From the FIG. 15(b), at a wavelength of around 420 nm, the AgN device shows an EQE enhancement factor lower than 1 (ITO shows better EQE). The EQE of the AgN device showed the strongest enhancement at a wavelength of around 570 nm and moderate enhancement at a wavelength of around 620 nm. Simulation results match well these experimental ones as shown in FIG. 19. In FIG. 19, calculated maps of optical absorption enhancement for nanowire devices are compared with ITO devices for transverse-magnetic (TM) light (see FIG. 19(a)) and for transverse-electric (TE) polarized light (see FIG. 19(b)), solar irradiance for the standard AM1.5 spectrum (FIG. 19(c)) and simulated optical absorption enhancement integrating TM and TE illuminations for nanowire device with 220 nm period (FIG. 19(d)). Simulated electric field profiles are shown in FIG. 19(e) for a nanowire device and in FIG. 19(f) for an ITO device at the wavelength 530 nm for TM illuminations Likewise, FIG. 19(g) shows simulated electric field profiles for the nanowire device and FIG. 19(h) for the ITO device for TE illuminations at 530 nm. All profiles are in the same color scales. The thickness of PEDOT (doped with PSS), CuPc, $C_{60}$ and BCP layer is 30 nm, 16 nm, 26 nm and 8 nm, respectively.

Other effects may also explain the observed enhancement of Jsc, such as light trapping by the light diffraction in grating structure and the device area increase caused by using 40 nm thick Ag grating as an anode. Both play little role in devices of the present disclosure, because a 220 nm period grating has minimal or no diffraction effect in the visible absorption band of the organic semiconductors; and devices fabricated with thicker metallic wires show very similar device performance including PCE.

In summary, in various aspects, the present disclosure provides a new method of forming a photovoltaic cell, such as a polymer organic solar cell via a novel ESSENCIAL-based technique to create a superior BHJ morphology as compared with conventional methods. A transparent metal electrode can also be formed prior to forming the active material having superior BHJ morphology. Thus, an enhanced BHJ morphology formed by a high speed roll-to-roll process permits a high efficiency polymer solar cell to be formed. Furthermore, the process is broadly applicable to BHJ structures using a variety of other known materials (for example, low band gap polymer semiconductors that demonstrate higher PCE), making it a potential manufacturing technique for mass production of low cost high efficiency polymer solar cells made of a variety of materials.

In various aspects, OSC efficiency enhancement can be achieved by SPR in periodic Ag nanowire electrodes and also by new processing methods of the present disclosure employing of organic materials. Transparent electrodes based on metallic nanostructure can replace conventional ITO electrode, because they have high optical transparency and good electrical conductivity. Moreover, unlike ITO, those properties can be adjusted relatively independently by changing the metal line width and thickness in the metal grid structure. Furthermore, such electrodes exhibit a greater flexibility than conventional ITO. Not only do metal electrodes provide excellent characteristics mentioned above, but also nanoscale metallic nanowire structures exhibit unique optical properties due to the excitation of surface plasmons, which has been exploited in specially designed solar cells to achieve enhanced light absorption and thus enhanced PCE. About 35% enhancement of PCE is demonstrated for the OSC using transparent Ag nanowire electrode as compared with the device using conventional ITO electrode. Further enhancement can be achieved by designing optimal structure of Ag nanowires to match the peak absorption in the organic materials.

In addition, the novel ESSENCIAL-based technique according to the present teachings shows the optimum BHJ morphology compared with conventional methods. Such techniques realize high efficiency polymer solar cells using high speed roll-to-roll process for low cost, high efficiency and large area OSCs.

What is claimed is:

1. A method of making a photovoltaic material by volatilization of a carrier through surface encapsulation and induced alignment, the method comprising:
   disposing a liquid precursor between a gas and solvent permeable layer and an electrode, the liquid precursor comprising an organic electron donor material, an organic electron acceptor material, and the carrier comprising a solvent; and
   applying pressure to the liquid precursor in a direction from the gas and solvent permeable layer through the liquid precursor and towards the electrode and removing at least a portion of the carrier comprising the solvent through the gas and solvent permeable layer to form a solid photovoltaic material comprising interpenetrating network domains of the organic electron donor material and the organic electron acceptor material.

2. The method of claim 1, wherein the gas and solvent permeable layer has a surface energy greater than a surface energy of the surrounding environment.

3. The method of claim 1, wherein the interpenetrating network domains of the organic electron donor material and the organic electron acceptor material are substantially uniform in a direction normal to the electrode.

4. The method of claim 1, further comprising removing the gas and solvent permeable layer from the solid photovoltaic material.

5. The method of claim 4, wherein the electrode is a first electrode and further comprising applying a second electrode to at least a portion of a surface of the solid photovoltaic material after removing the gas and solvent permeable layer from the solid photovoltaic material.

6. The method of claim 5, wherein the second electrode comprises aluminum and lithium fluoride.

7. The method of claim 1, further comprising applying heat to the solid photovoltaic material to modify crystal morphology of the solid photovoltaic material.

8. The method of claim 1, further comprising adjusting a thickness of the liquid precursor disposed between the gas and solvent permeable layer and the electrode by changing the amount of the organic electron donor material, the organic electron acceptor material, or the carrier in the liquid precursor or by changing the pressure in the applying step.

9. The method of claim 1, wherein the disposing step and the applying step are performed using a roll-to-roll process.

10. The method of claim 9, further comprising adjusting the thickness of the liquid precursor disposed between the gas and solvent permeable layer and the electrode by changing the carrier concentration, applied pressure, and/or rolling speed.

11. The method of claim 1, wherein the liquid precursor is disposed directly onto the electrode without any buffer layer therebetween.

12. The method of claim 1, wherein the electrode comprises a transparent conductive electrode (TCE).

13. The method of claim 12, wherein the TCE comprises an indium-tin-oxide (ITO) electrode; a transparent metal electrode (TME) comprising a metallic nanograting; or an interconnected random network of metallic nanowires.

14. The method of claim 13, wherein the metallic nanograting comprises silver nanowires.

15. The method of claim 1, wherein the organic electron donor material comprises poly(3-hexylthiophene) (P3HT) and the organic electron acceptor material comprises [6,6]-phenyl $C_{61}$ butyric acid methyl ester (PCBM).

16. A method of making a photovoltaic material by volatilization of a carrier through surface encapsulation and induced alignment, the method comprising:
   disposing a liquid precursor between a gas and solvent permeable layer comprising polydimethylsiloxane (PDMS) and an electrode, the liquid precursor comprising an organic electron donor material, an organic electron acceptor material, and the carrier comprising a solvent; and
   applying pressure in a direction from the gas and solvent permeable layer to the liquid precursor and towards the electrode and removing at least a portion of the carrier comprising the solvent through the gas and solvent permeable layer through form a solid photovoltaic material comprising interpenetrating network domains of the organic electron donor material and the organic electron acceptor material.

17. The method of claim 16, wherein the interpenetrating network domains of the organic electron donor material and the organic electron acceptor material are substantially uniform in a direction normal to the electrode.

18. The method of claim 16, further comprising removing the gas and solvent permeable layer from the solid photovoltaic material.

19. The method of claim 18, wherein the electrode is a first electrode and further comprising applying a second electrode to at least a portion of a surface of the solid photovoltaic material after removing the gas and solvent permeable layer from the solid photovoltaic material.

20. The method of claim 16, further comprising applying heat to the solid photovoltaic material to modify crystal morphology of the solid photovoltaic material.

21. The method of claim 16, wherein the disposing step and the applying step are performed using a roll-to-roll process.

22. The method of claim 16, wherein the liquid precursor is disposed directly onto the electrode without any buffer layer therebetween.

23. The method of claim 16, wherein the electrode comprises a transparent conductive electrode (TCE).

24. The method of claim 23, wherein the TCE comprises an indium-tin-oxide (ITO) electrode; a transparent metal electrode (TME) comprising a metallic nanograting; or an interconnected random network of metallic nanowires.

25. The method of claim 16, wherein the organic electron donor material comprises poly(3-hexylthiophene) (P3HT) and the organic electron acceptor material comprises [6,6]-phenyl $C_{61}$ butyric acid methyl ester (PCBM).

26. A method of making a photovoltaic material by volatilization of a carrier through surface encapsulation and induced alignment, the method comprising:

disposing a liquid precursor between a gas and solvent permeable layer having a flat contact surface and an electrode, the liquid precursor comprising an organic electron donor material, an organic electron acceptor material, and the carrier comprising a solvent; and applying pressure in a direction from the flat contact surface through the liquid precursor and towards the electrode and removing at least a portion of the carrier comprising the solvent through the gas and solvent permeable layer to form a solid photovoltaic material comprising interpenetrating network domains of the organic electron donor material and the organic electron acceptor material that are substantially uniform in a direction normal to the electrode.

27. The method of claim 26, further comprising applying heat to the solid photovoltaic material to modify crystal morphology of the solid photovoltaic material.

28. The method of claim 26, wherein the disposing step and the applying step are performed using a roll-to-roll process.

29. The method of claim 26, wherein the liquid precursor is disposed directly onto the electrode without any buffer layer therebetween.

30. The method of claim 26, wherein the electrode comprises a transparent conductive electrode (TCE).

31. The method of claim 26, wherein the organic electron donor material comprises poly(3-hexylthiophene) (P3HT) and the organic electron acceptor material comprises [6,6]-phenyl $C_{61}$ butyric acid methyl ester (PCBM).

* * * * *